(12) United States Patent
Okamura et al.

(10) Patent No.: US 11,683,883 B2
(45) Date of Patent: Jun. 20, 2023

(54) SEMICONDUCTOR APPARATUS

(71) Applicant: SEIKO EPSON CORPORATION, Tokyo (JP)

(72) Inventors: Yukio Okamura, Nagano (JP); Toru Matsuyama, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 108 days.

(21) Appl. No.: 17/184,666

(22) Filed: Feb. 25, 2021

(65) Prior Publication Data
US 2021/0274641 A1 Sep. 2, 2021

(30) Foreign Application Priority Data
Feb. 27, 2020 (JP) .............................. JP2020-031811

(51) Int. Cl.
*H05K 1/02* (2006.01)
*H05K 1/18* (2006.01)
(Continued)

(52) U.S. Cl.
CPC ..... *H05K 1/029* (2013.01); *G01R 31/318538* (2013.01); *G01R 31/318572* (2013.01); *G01R 31/318597* (2013.01); *H01L 23/49816* (2013.01); *H05K 1/0268* (2013.01); *H05K 1/0287* (2013.01); *H05K 1/111* (2013.01);
(Continued)

(58) Field of Classification Search
None
See application file for complete search history.

(56) References Cited

U.S. PATENT DOCUMENTS 6,415,348 B1 * 7/2002 Mergard ............. G06F 13/4004
710/305
6,678,838 B1 * 1/2004 Magro ................ G06F 11/3656
711/147
(Continued)

FOREIGN PATENT DOCUMENTS

JP 2004-022664 A 1/2004
JP 2004-342947 A 12/2004
(Continued)

*Primary Examiner* — Guerrier Merant
(74) *Attorney, Agent, or Firm* — Global IP Counselors, LLP

(57) ABSTRACT

There is provided a semiconductor apparatus including a memory controller; a CPU; a high-speed communication controller; a memory operation terminal group that includes a plurality of memory operation terminals for inputting a first signal propagating between an external memory group and the memory controller; a high-speed communication terminal group that includes a plurality of high-speed communication terminals for inputting a second signal to the high-speed communication controller; an inspection terminal group that includes a plurality of inspection terminals for acquiring information from the CPU and performing debugging; and a terminal mounting surface at which the memory operation terminal group, the high-speed communication terminal group, and the inspection terminal group are provided, in which at the terminal mounting surface, a first inspection terminal among the plurality of inspection terminals is located between the memory operation terminal group and the high-speed communication terminal group.

16 Claims, 8 Drawing Sheets

(51) Int. Cl.
*H01L 23/498* (2006.01)
*G01R 31/3185* (2006.01)
*H05K 1/11* (2006.01)

(52) U.S. Cl.
CPC ... *H05K 1/181* (2013.01); *H05K 2201/10159* (2013.01); *H05K 2201/10212* (2013.01)

(56) References Cited

U.S. PATENT DOCUMENTS

| | | |
|---|---|---|
| 2004/0232548 A1 | 11/2004 | Maruko |
| 2006/0231935 A1 | 10/2006 | Nishida |
| 2007/0006035 A1 | 1/2007 | Usui |
| 2013/0238933 A1* | 9/2013 | Shin .................. G06F 11/27 |
| | | 714/30 |
| 2018/0270956 A1 | 9/2018 | Kimura |

FOREIGN PATENT DOCUMENTS

| | | | |
|---|---|---|---|
| JP | 2006-294976 A | 10/2006 | |
| JP | 2018-157098 A | 10/2018 | |
| WO | WO-2005022390 A1 * | 3/2005 | ............ G06F 11/261 |

* cited by examiner

FIG. 3
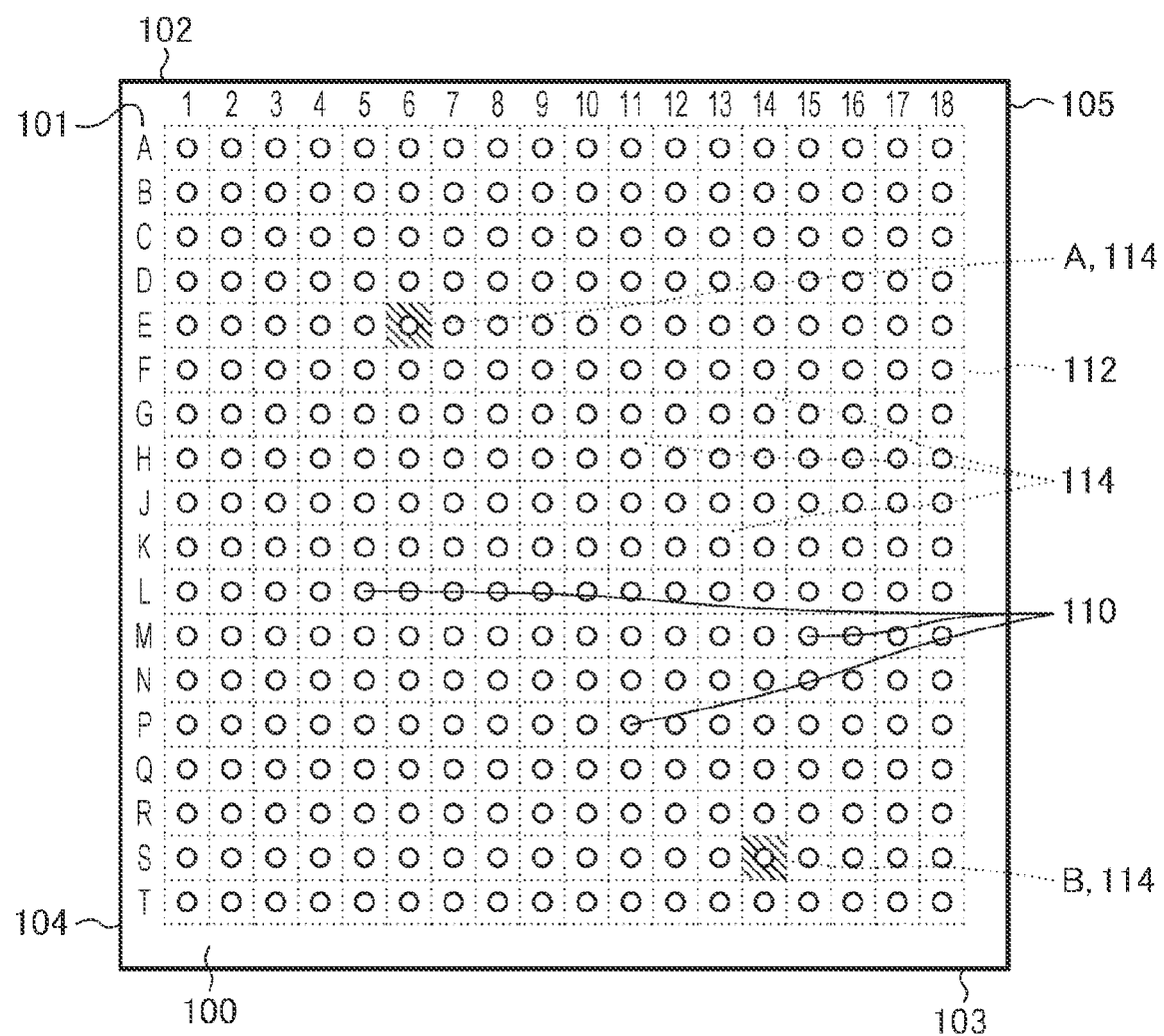
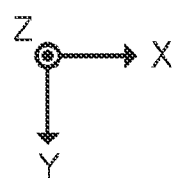

FIG. 4
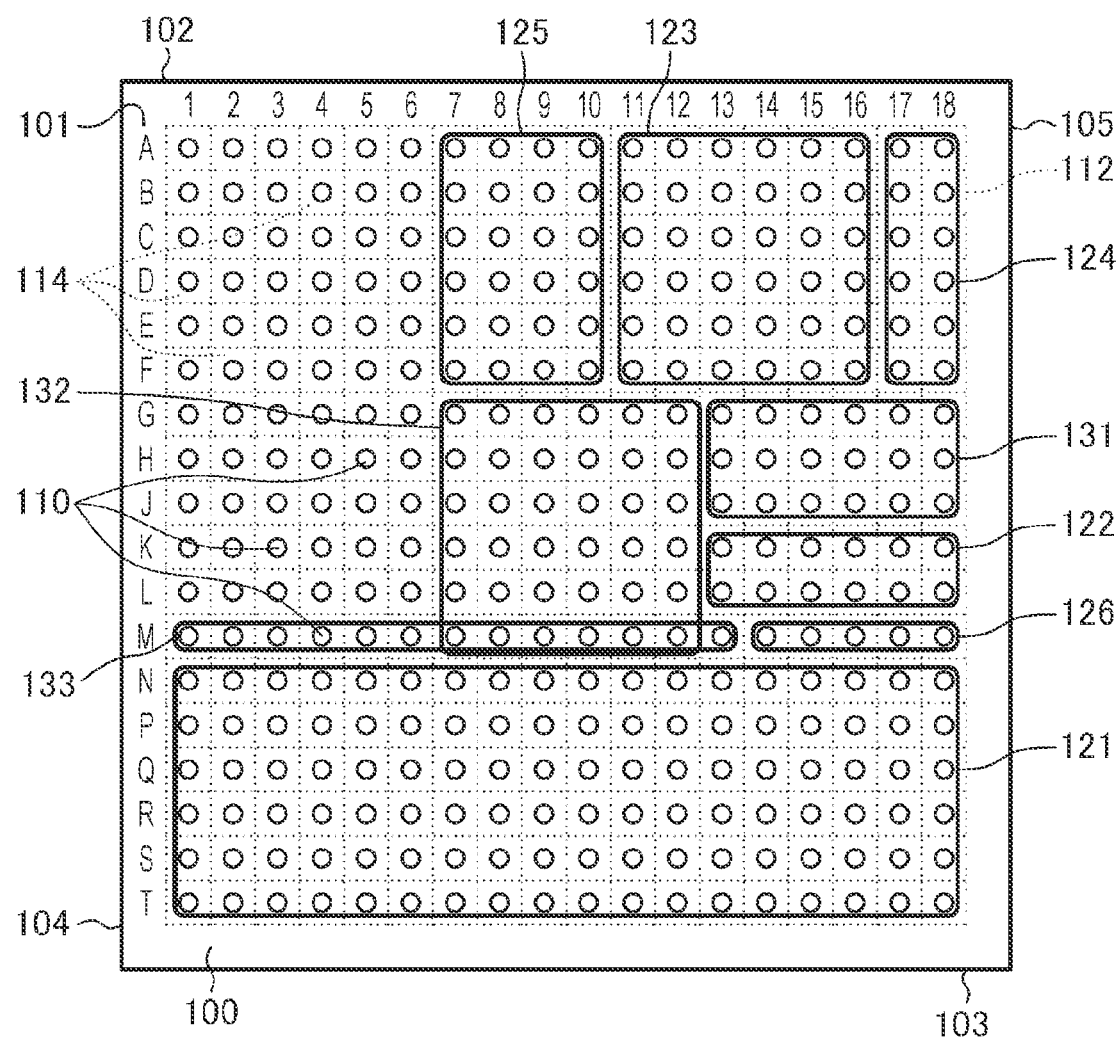
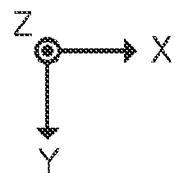

FIG. 6
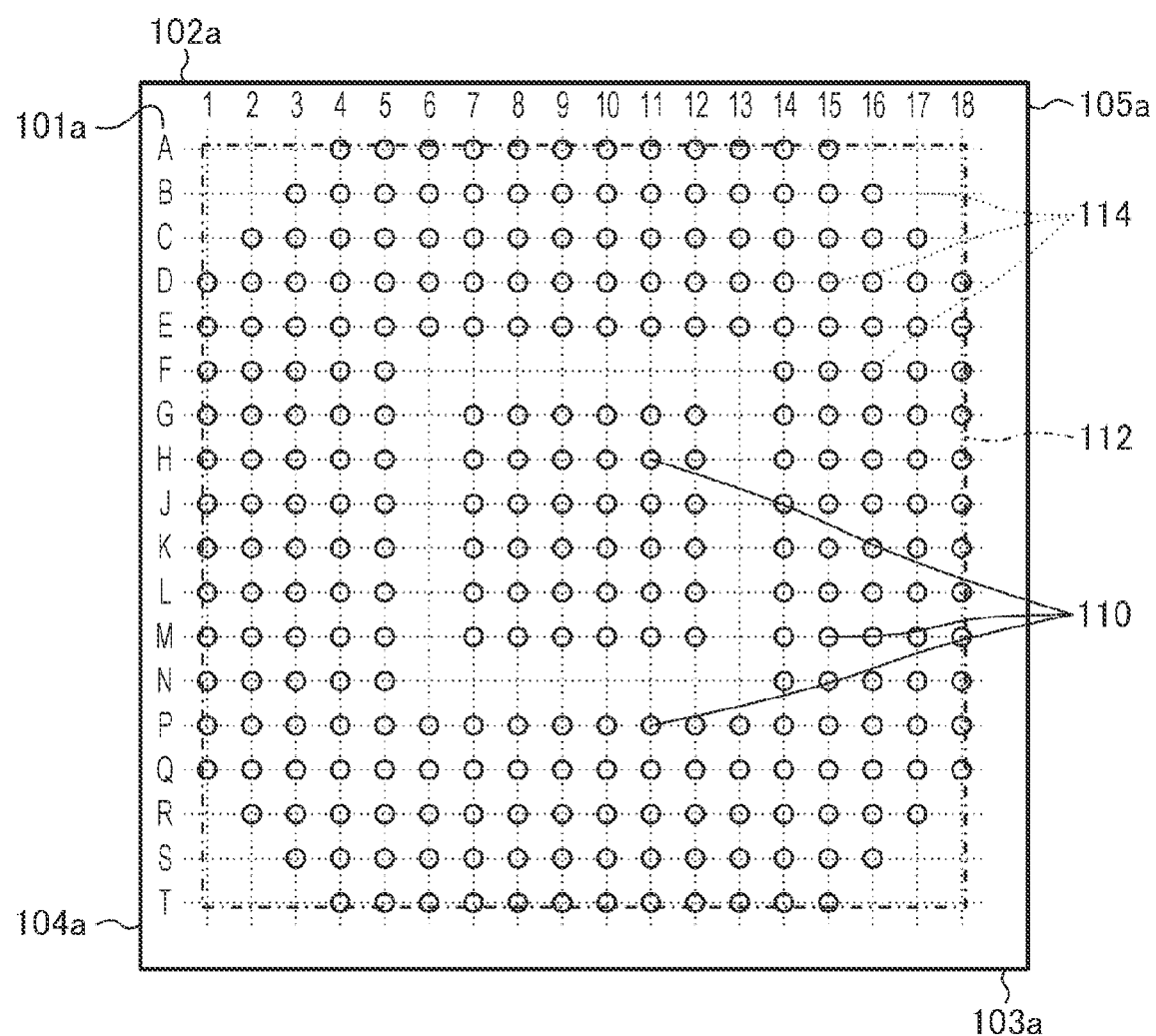
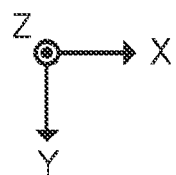

FIG. 8
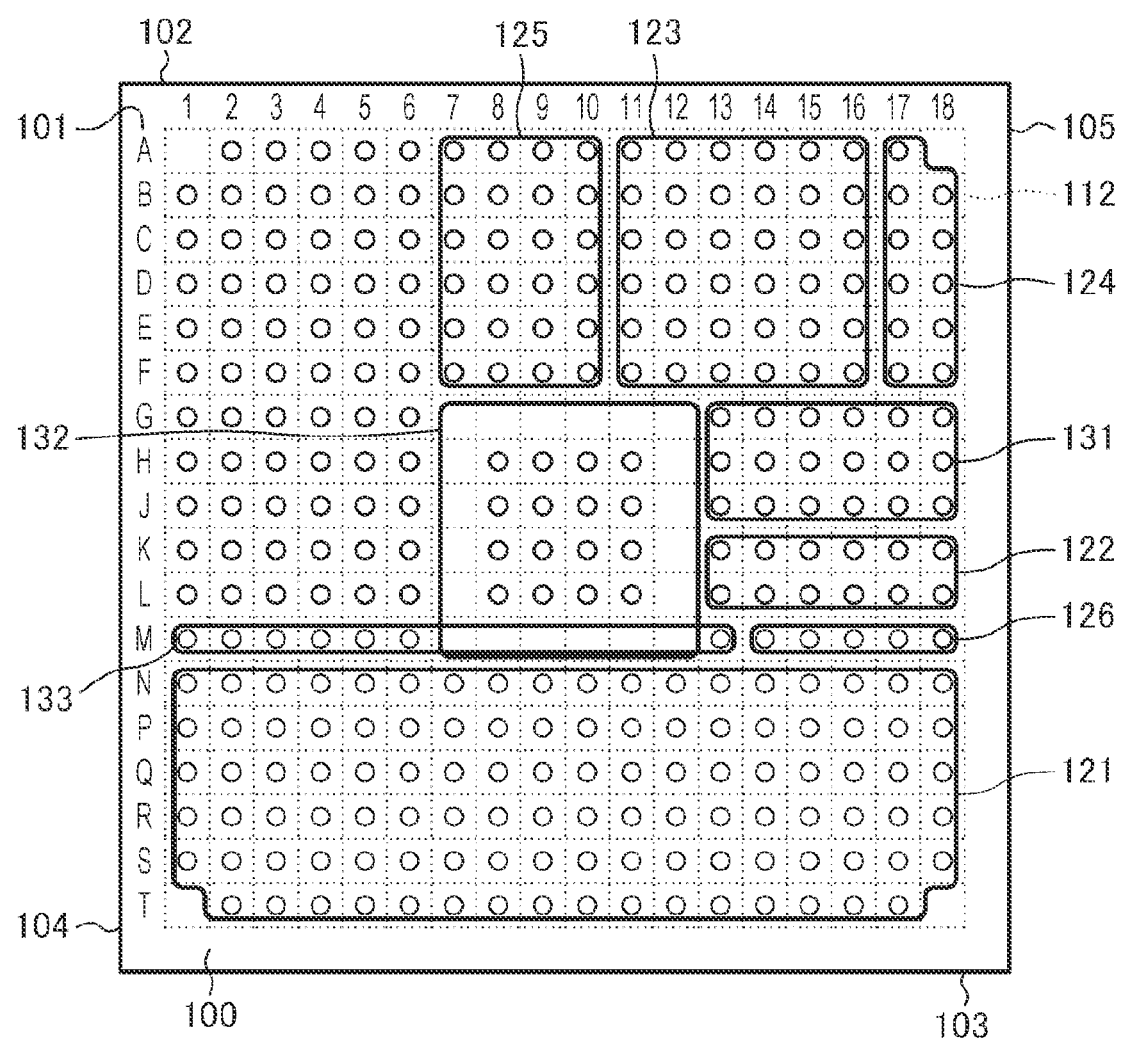
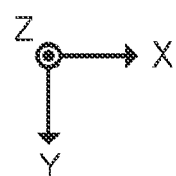

SEMICONDUCTOR APPARATUS

The present application is based on, and claims priority from JP Application Serial Number 2020-031811, filed Feb. 27, 2020, the disclosure of which is hereby incorporated by reference herein in its entirety.

BACKGROUND

1. Technical Field

The present disclosure relates to a semiconductor apparatus.

2. Related Art

As semiconductor apparatuses become more integrated and highly functional, a semiconductor apparatus having many functions is widespread such as a system on chip (SoC) or a field-programmable gate array (FPGA) in which many functions are provided in one semiconductor apparatus.

The semiconductor apparatus having such many functions requires many terminals for inputting and outputting signals according to the functions, and as a result, the number of terminals provided in the semiconductor apparatus is increased. Since such an increase in the number of terminals included in the semiconductor apparatus is harmful from the viewpoint of miniaturization of the semiconductor apparatus, the terminals are arranged at a narrow pitch as the number of terminals included in the semiconductor apparatus increases. Meanwhile, when the terminals are arranged at the narrow pitch in the semiconductor apparatus, the influence of electric crosstalk or the like becomes large between the terminals, and as a result, the semiconductor apparatus may malfunction. That is, various adverse effects occur from the viewpoint of improving reliability of the semiconductor apparatus having many functions.

For such an adverse effect, JP-A-2004-342947 discloses a technology for reducing a possibility that an area in which terminals are mounted in a semiconductor apparatus becomes large by separately arranging an area in which a terminal which is not used by a user such as a test terminal is arranged and an area in which a terminal which is used by the user is arranged, and making a distance between the terminals in the area in which the terminal which is not used by the user is arranged smaller than a distance between the terminals in the area in which the terminal used by the user is arranged.

Further, JP-A-2004-022664 discloses a technology of arranging a large number of terminals in a semiconductor apparatus while reducing a possibility that an area in which the terminals are mounted in the semiconductor apparatus becomes large by arranging an inspection terminal provided as a land grid array (LGA) between external terminals provided as a ball grid array (BGA) arranged in a grid pattern.

Meanwhile, functions required of the semiconductor apparatuses are increased day by day, and along with this, the number of terminals provided in the semiconductor apparatuses is also increased. Therefore, from the viewpoint of reducing a possibility that a terminal mounting area in the semiconductor apparatus is enlarged and reducing a possibility that signals interfere with each other between the terminals of the semiconductor apparatus, the disclosures described in JP-A-2004-342947 and JP-A-2004-022664 still have room for improvement.

SUMMARY

According to an aspect of the present disclosure, there is provided a semiconductor apparatus including: a memory controller; a CPU; a high-speed communication controller; a memory operation terminal group that includes a plurality of memory operation terminals for inputting a first signal propagating between an external memory group and the memory controller; a high-speed communication terminal group that includes a plurality of high-speed communication terminals for inputting a second signal to the high-speed communication controller; an inspection terminal group that includes a plurality of inspection terminals for acquiring information from the CPU and performing debugging; and a terminal mounting surface at which the memory operation terminal group, the high-speed communication terminal group, and the inspection terminal group are provided, in which at the terminal mounting surface, a first inspection terminal among the plurality of inspection terminals is located between the memory operation terminal group and the high-speed communication terminal group.

BRIEF DESCRIPTION OF THE DRAWINGS

FIG. 3 is a diagram illustrating an example of arrangement of a plurality of terminals provided at a terminal mounting surface.

FIG. 4 is a diagram illustrating an example when signals propagating at the plurality of terminals in the semiconductor apparatus are assigned to each terminal.

FIG. 6 is a diagram for explaining a case where a mounting area and a terminal mounting area are determined based on the arrangement of the plurality of terminals provided at the terminal mounting surface.

FIG. 8 is a diagram illustrating an example when signals propagating at a plurality of terminals in a semiconductor apparatus according to a third embodiment are assigned to each terminal.

DESCRIPTION OF EXEMPLARY EMBODIMENTS

Hereinafter, appropriate embodiments of the present disclosure will be described with reference to drawings. The used drawings are for convenience of explanation. The embodiments to be described below do not unfairly limit contents of the disclosure described in the claims. In addition, all of configurations to be described below are not essential components of the disclosure.

1. First Embodiment

1.1 Functional Configuration of Semiconductor Apparatuses

Figure 1:
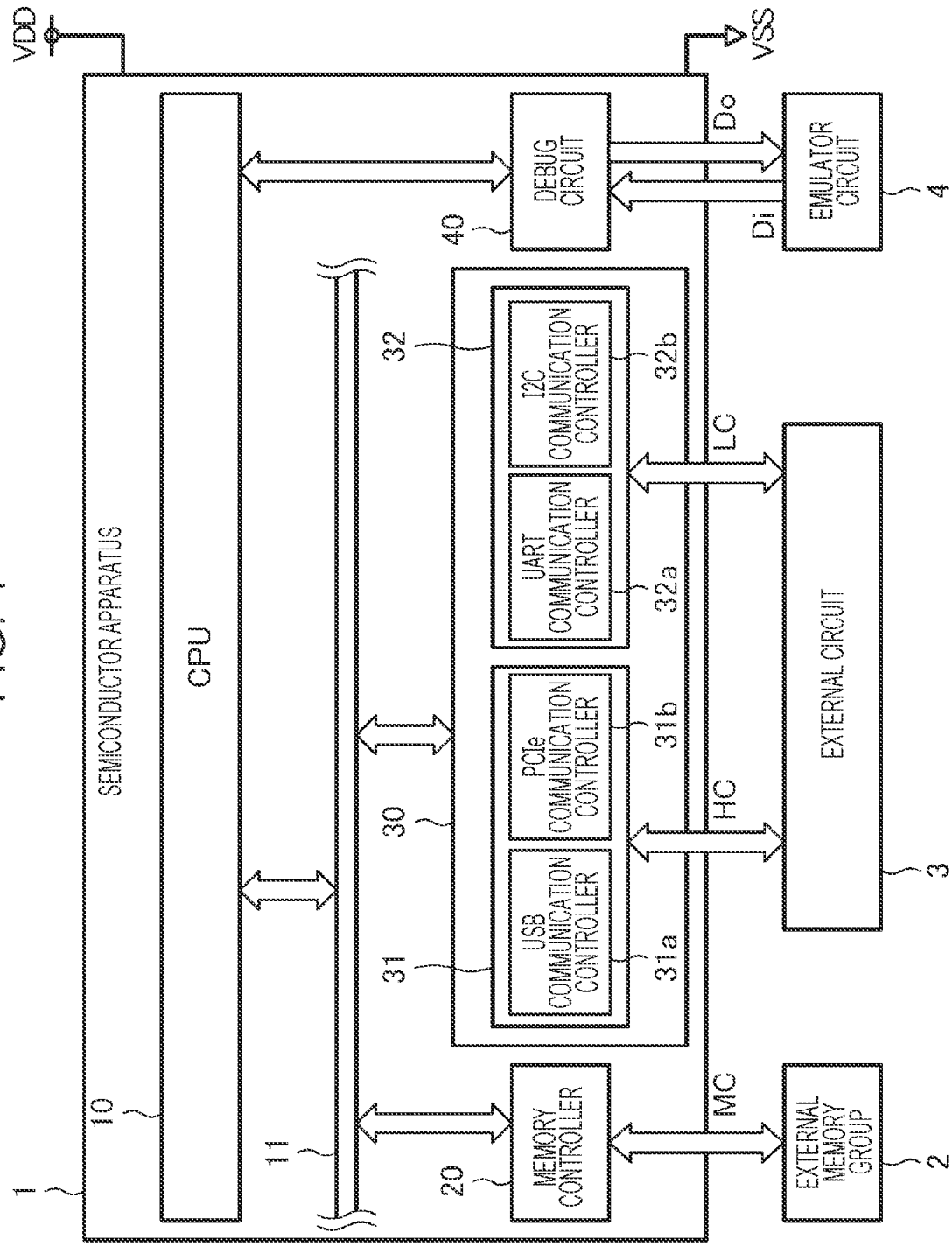
FIG. 1 is a diagram illustrating a functional configuration of a semiconductor apparatus.

FIG. 1 is a diagram illustrating a functional configuration of a semiconductor apparatus 1. As illustrated in FIG. 1, the semiconductor apparatus 1 includes a Central Processing Unit (CPU) 10, a memory controller 20, and a communication controller 30. The CPU 10, the memory controller 20, and the communication controller 30 are communicably coupled via a bus wiring 11. Further, a voltage VDD as a power supply voltage and a voltage VSS which is a reference potential of the semiconductor apparatus 1, for example, a ground potential, are input to the semiconductor apparatus 1.

The CPU 10 is responsible for controlling the entire semiconductor apparatus 1. Specifically, the CPU 10 controls writing of information to an external memory group 2 and reading of information held by the external memory group 2 by outputting a control signal for controlling the memory controller 20.

Based on the control signal input from the CPU 10, the memory controller 20 outputs a memory control signal MC for controlling the reading of information held in the external memory group 2 provided outside the semiconductor apparatus 1 and the writing of information to the external memory group 2.

Specifically, the external memory group 2 includes a dynamic random access memory (DRAM) or a static random access memory (SRAM) provided with a plurality of memory cell circuits for holding information. When the control signal for reading the information held in the external memory group 2 is input from the CPU 10 to the memory controller 20, the memory controller 20 generates the memory control signal MC for accessing the memory cell circuit in which the information is held and outputs the memory control signal MC to the external memory group 2, according to the input control signal. That is, by using the memory control signal MC, the memory controller 20 accesses the corresponding memory cell circuit included in the external memory group 2 and reads out the information held in the memory cell circuit. The memory controller 20 outputs the information read from the external memory group 2 to the CPU 10.

Further, when a control signal for holding new information in the external memory group 2 is input from the CPU 10 to the memory controller 20, according to the input control signal, the memory controller 20 generates the memory control signal MC for accessing a memory cell circuit in which the information is held and output the memory control signal MC to the external memory group 2. That is, by using the memory control signal MC, the memory controller 20 accesses the corresponding memory cell circuit included in the external memory group 2 and causes the memory cell circuit to hold the information supplied from the CPU 10.

Here, the memory control signals MC propagating between the semiconductor apparatus 1 and the external memory group 2 may include a plurality of signals according to the number of memory cell circuits included in the external memory group 2, the amount of information held in the external memory group 2, and the like. That is, the memory control signal MC propagates via a plurality of wirings and terminals communicably coupled between the semiconductor apparatus 1 and the external memory group 2, and the semiconductor apparatus 1 includes a plurality of terminals for inputting or outputting the memory control signal MC.

Further, the CPU 10 executes a process based on the information read from the external memory group 2 via the memory controller 20, and outputs a signal according to a result of the executed process to an external circuit 3 provided outside the semiconductor apparatus 1, via the communication controller 30.

The communication controller 30 includes a high-speed communication controller 31 and a low-speed communication controller 32.

The low-speed communication controller 32 includes a circuit for generating a signal in accordance with a communication method capable of transferring data to and from the external circuit 3 using a signal having a frequency of several kHz to several MHz. The low-speed communication controller 32 converts a signal input from the CPU 10 into a signal in accordance with the communication method, and outputs the converted signal as a low-speed communication signal LC to the external circuit 3 provided outside the semiconductor apparatus 1.

As such a low-speed communication controller 32, the semiconductor apparatus 1 according to the present embodiment includes a UART communication controller 32a which controls communication in accordance with a universal asynchronous receiver/transmitter (UART) communication standard capable of transferring data at a frequency of several hundred Hz to several hundred kHz, and an I2C communication controller 32b which controls communication in accordance with an inter-integrated circuit (I2C) communication standard capable of transferring data at a frequency of several hundred kHz to several MHz. The low-speed communication controller 32 included in the semiconductor apparatus 1 may be any communication method capable of transferring data at a frequency of several kHz to several MHz, and is not limited to the UART communication controller 32a and the I2C communication controller 32b. Further, the low-speed communication controller 32 included in the semiconductor apparatus 1 may include the UART communication controllers 32a equal to or more than two, or may include the I2C communication controllers 32b equal to or more than two.

Here, the low-speed communication signal LC propagating between the semiconductor apparatus 1 and the external circuit 3 may include a plurality of signals according to specifications of the based communication method. That is, the low-speed communication signal LC propagates via a plurality of wirings and terminals communicably coupled between the semiconductor apparatus 1 and the external circuit 3, and the semiconductor apparatus 1 includes a plurality of terminals for inputting or outputting the low-speed communication signal LC.

The high-speed communication controller 31 controls communication capable of transferring data at a higher frequency than the low-speed communication controller 32. Specifically, the high-speed communication controller 31 includes a circuit for generating a signal in accordance with a communication method capable of transferring data to and from the external circuit 3 using a signal having a frequency equal to or more than several MHz. The high-speed communication controller 31 converts a signal input from the CPU 10 into a signal in accordance with the communication method, and outputs the converted signal as a high-speed communication signal HC to the external circuit 3 provided outside the semiconductor apparatus 1.

As such a high-speed communication controller 31, the semiconductor apparatus 1 according to the present embodiment includes a universal serial bus (USB) communication controller 31a which controls communication in accordance with a USB communication standard capable of transferring data at a frequency equal to or more than 12 MHz, and a peripheral component interconnect express (PCIe) communication controller 31b which controls PCIe communication capable of transferring data at a frequency equal to or more than several GHz. The high-speed communication controller 31 included in the semiconductor apparatus 1 may be any communication method capable of transferring data at a frequency equal to or more than several MHz, and is not limited to the USB communication controller 31a and the PCIe communication controller 31b. Further, the high-speed communication controller 31 included in the semiconductor apparatus 1 may include the USB communication controllers 31a equal to or more than two, or may include the PCIe communication controllers 31b equal to or more than two.

Here, the high-speed communication controller 31 may be any communication method capable of transferring data at a frequency equal to or more than several MHz, but is preferably a controller which controls a communication method in accordance with a communication method capable of transferring data at a high-frequency equal to or more than 5 GHz. In other words, the high-speed communication controller 31 may perform communication at a frequency equal to or more than 5 GHz. Examples of such a high-speed communication controller 31 include the USB communication controller 31a in accordance with a communication standard of USB 3.0 capable of transferring data at a frequency equal to or more than 5 GHz, the PCIe communication controller 31b described above, and the like.

As a frequency of data transfer in the high-speed communication controller 31 increases, the amount of information per unit time included in a signal output from the high-speed communication controller 31 and a signal input to the high-speed communication controller 31 increases, and the semiconductor apparatus 1 can realize more functions. Meanwhile, when a frequency of a communication signal output from the high-speed communication controller 31 becomes high, there is an increased possibility that electric crosstalk occurs due to the communication signal and a switching noise caused by the operation of the high-speed communication controller 31. Although details will be described below with respect to such a problem, the semiconductor apparatus 1 according to the first embodiment can reduce mutual interference between the plurality of terminals for coupling the semiconductor apparatus 1 and an external device. That is, even when the high-speed communication controller 31 communicates at a high-frequency equal to or more than 5 GHz, it is possible to reduce the possibility that the noise generated by the operation of the high-speed communication controller 31 affects the semiconductor apparatus 1.

Here, the high-speed communication signal HC propagating between the semiconductor apparatus 1 and the external circuit 3 may include a plurality of signals according to specifications of the based communication method. That is, the high-speed communication signal HC propagates via a plurality of wirings and terminals communicably coupled between the semiconductor apparatus 1 and the external circuit 3, and the semiconductor apparatus 1 includes a plurality of terminals for inputting or outputting the high-speed communication signal HC.

As described above, the CPU 10 responsible for overall control of the semiconductor apparatus 1 may have a plurality of cores, include a microarchitecture which implements a command set of 64 bits or more, and be driven at a frequency equal to or more than 1.6 GHz. Here, at the CPU 10 satisfying the performance described above, a processor which inherits the functions of the ARMv7A architecture, which is expected to be used especially as an application among the ARM architectures released by ARM, for example, specifically, a processor of the ARM Cortex-A17 or later may be mounted.

The ARM Cortex-A17 has a floating point unit only (FPU) mounted inside, the number of via circuit blocks when a process is executed is reduced, as compared with the CPU in the related art in which the floating point unit only is externally mounted. Therefore, it is possible to operate at a high speed while reducing the power consumption of the semiconductor apparatus 1 when processing a large amount of data. Therefore, in the semiconductor apparatus 1 provided with the CPU 10 in which the ARM Cortex-A17 or later processor is mounted, a mounting area can be reduced while performing more processes with less power. Although the details will be described below, by including the CPU 10 in which the processor of ARM Cortex-A17 or later is mounted, in the semiconductor apparatus 1 according to the present embodiment, many functions can be implemented, and even when the number of terminals for coupling the semiconductor apparatus 1 having many functions and the external device is increased, mutual interference of signals between the terminals can be reduced.

Further, the semiconductor apparatus 1 includes a debug circuit 40 for debugging the semiconductor apparatus 1. A data signal Di is input to the debug circuit 40 from an emulator circuit 4 provided externally. The debug circuit 40 generates a signal for executing debugging on the semiconductor apparatus 1 and the CPU 10 based on the input data signal Di, and outputs the signal to the CPU 10.

The CPU 10 executes a process according to the signal based on the data signal Di input from the debug circuit 40, and outputs a signal including information indicating the processing result to the debug circuit 40. After that, the debug circuit 40 generates a data signal Do according to the information input from the CPU 10 and outputs the data signal Do to the emulator circuit 4. The emulator circuit 4 determines whether or not the semiconductor apparatus 1 including the CPU 10 is normal, based on whether or not the data signal Do input from the debug circuit 40 is the signal according to the data signal Di output to the debug circuit 40.

A method for determining whether or not the semiconductor apparatus 1 including the CPU 10 is normal is preferably a method in accordance with the joint test action group (JTAG) standard. As a result, reliability of debugging on the semiconductor apparatus 1 and the CPU 10 can be improved. The debug circuit 40 according to the present embodiment will be described as performing a test in accordance with the JTAG standard based on the data signal Di input from the emulator circuit 4.

Here, the data signals Di and Do propagating between the semiconductor apparatus 1 and the emulator circuit 4 may include a plurality of signals according to a method of debugging the semiconductor apparatus 1 and the CPU 10 to be executed. For example, when a debug to be executed on the semiconductor apparatus 1 and the CPU 10 is executed by the method in accordance with the JTAG standard described above, the data signal Di includes a plurality of signals including an input data signal input from the emulator circuit 4, a mode selection signal for selecting an inspection mode, a clock signal, and a reset signal, and the data signal Do includes a plurality of signals including an output data signal indicating a debug result. That is, the data signal Di and the data signal Do propagate via a plurality of wirings and terminals communicably coupled between the semiconductor apparatus 1 and the emulator circuit 4, and the semiconductor apparatus 1 includes a plurality of terminals for inputting or outputting the data signal Di and the data signal Do.

1.2 Structure of Semiconductor Apparatus

Figure 2:
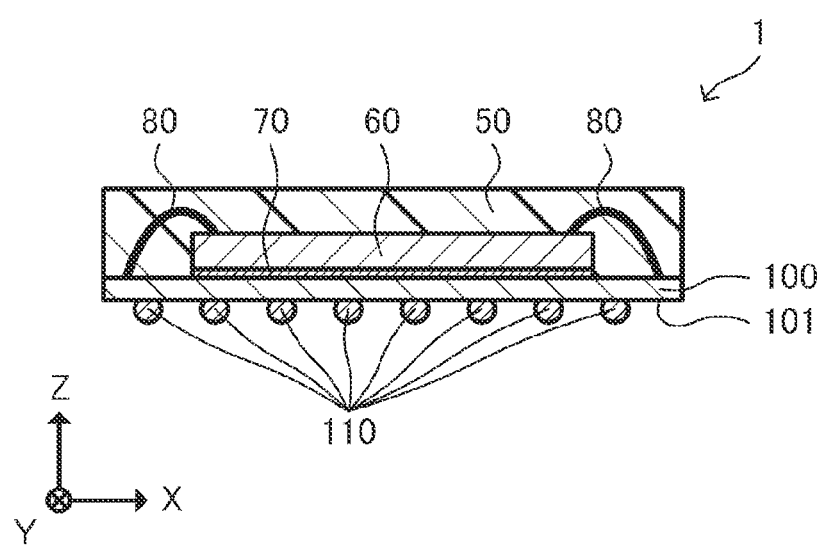
FIG. 2 is a diagram illustrating a cross-sectional structure of the semiconductor apparatus.

Next, an example of a structure of the semiconductor apparatus 1 will be described. FIG. 2 is a diagram illustrating a cross-sectional structure of the semiconductor apparatus 1. In the following description, the X-direction, the Y-direction, and the Z-direction, which are orthogonal to each other as illustrated in the drawing, will be used. Further, in some cases, a tip side in the X-direction is referred to as a +X side and a starting point side is referred to as a −X side, a tip side in the Y-direction is referred to as a +Y side and a starting point side is referred to as a −Y side, and a tip side in the Z-direction is referred to as a +Z side and a starting point side is referred to as the −Z side, as illustrated.

As illustrated in FIG. 2, the semiconductor apparatus 1 includes a printed wiring substrate 100, an IC chip 60, and a housing 50.

The CPU 10, the memory controller 20, the communication controller 30, and the debug circuit 40 described above are mounted at the IC chip 60.

The printed wiring substrate 100 is located on the −Z side of the IC chip 60. The IC chip 60 is attached to the printed wiring substrate 100 via a joining member 70 such as an adhesive. Further, the printed wiring substrate 100 and the IC chip 60 are electrically coupled via a bonding wire 80.

The printed wiring substrate 100 is provided with a plurality of wiring patterns (not illustrated) and a plurality of electrodes (not illustrated). The bonding wire 80 is electrically coupled to an electrode (not illustrated) formed at the +Z side surface of the printed wiring substrate 100. Further, terminals 110 are provided at each of the plurality of electrodes (not illustrated) formed at a surface of the printed wiring substrate 100 on the −Z side. Each of a plurality of terminals 110 includes, for example, a solder ball. The semiconductor apparatus 1, and the external memory group 2 and the external circuit 3 provided outside the semiconductor apparatus 1 are electrically and physically coupled by the solder balls. That is, the semiconductor apparatus 1 according to the present embodiment is configured to include a so-called ball grid array (BGA) package which is electrically and mechanically coupled to the outside of the semiconductor apparatus 1 via a plurality of solder balls. Here, in the following description, a surface on the −Z side of the printed wiring substrate 100 provided with the plurality of terminals 110 is referred to as a terminal mounting surface 101.

In the semiconductor apparatus 1 configured as described above, a signal input to the semiconductor apparatus 1 via the terminal 110 provided at the terminal mounting surface 101 propagates via an electrode and a wiring pattern (not illustrated), and the bonding wire 80 provided at the printed wiring substrate 100, and input to the IC chip 60. Further, a signal output from the IC chip 60 is output to the outside of the semiconductor apparatus 1 via the bonding wire 80, the electrodes and wiring patterns (not illustrated) provided at the printed wiring substrate 100, and the terminal 110. That is, the printed wiring substrate 100 functions as an interposer substrate.

The housing 50 is located on the +Z side of the IC chip 60 and is joined to the printed wiring substrate 100 so as to cover the IC chip 60. The housing 50 contains an epoxy resin or the like to protect the IC chip 60.

1.3 Terminal Arrangement in Semiconductor Apparatuses

Next, an example of arranging the plurality of terminals 110 provided at the terminal mounting surface 101 will be described with reference to FIG. 3. FIG. 3 is a diagram illustrating an example of arrangement of the plurality of terminals 110 provided at the terminal mounting surface 101.

As illustrated in FIG. 3, the terminal mounting surface 101 includes sides 102 and 103 which are located extending in a direction along the X-direction and facing each other in a direction along the Y-direction, and sides 104 and 105 which are located extending in the direction along the Y-direction and facing each other in the direction along the X-direction. The side 104 intersects both the sides 102 and 103, and the side 105 intersects both the sides 102 and 103. That is, the terminal mounting surface 101 has a substantially rectangular shape having the sides 102 to 105 as an outer circumference. Here, the side 105 included in the terminal mounting surface 101 is an example of a first side, and the side 103 intersecting the side 105 is an example of a second side. Further, the side 104 included in the terminal mounting surface 101 and located facing the side 105 is an example of a third side, and the side 102 located facing the side 103 is an example of a fourth side.

FIG. 3 illustrates a mounting area 112 in which the terminal 110 is mounted. The mounting area 112 includes a plurality of terminal mounting areas 114 provided in a grid pattern. In the terminal mounting area 114, n sets of m terminal mounting areas 114 provided side by side in a direction along the side 102 are provided in the mounting area 112 in a direction along the side 104. That is, a total of n×m terminal mounting areas 114 are provided in the mounting area 112 of the terminal mounting surface 101. In the example illustrated in FIG. 3, 18 sets of 18 terminal mounting areas 114 provided side by side in the direction along the side 102 are illustrated as being provided in 18 sets in the direction along the side 104. That is, FIG. 3 illustrates a total of 324 terminal mounting areas 114.

Here, in the following description, a direction from the side 104 to the side 105 along the side 102 may be referred to as a row direction, and a direction from the side 102 to the side 103 along the side 104 may be referred to as a column direction. In the following description, among the plurality of terminal mounting areas 114, the terminal mounting area 114 located at the i-th position along the row direction and the j-th position along the column direction is referred to as the terminal mounting area 114-*ij*, in some cases. Specifically, the terminal mounting area 114 indicated as A in FIG. 3 may be referred to as a terminal mounting area 114-6E, and the terminal mounting area 114 indicated as B may be referred to as a terminal mounting area 114-14S.

Each of the plurality of terminals 110 provided at the terminal mounting surface 101 is located corresponding to each of the terminal mounting areas 114 provided in a grid pattern. Here, in the following description, the terminal 110 located in the terminal mounting area 114-*ij* may be referred to as the terminal 110-*ij*. That is, the terminal 110 located in the terminal mounting area 114-6E indicated as A in FIG. 3 may be referred to as the terminal 110-6E, and the terminal 110 located in the terminal mounting area 114-14S indicated as B may be referred to as the terminal 110-14S, in some cases. The example of the arrangement of the terminals 110 is illustrated in FIG. 3 when the terminals 110 are located in all the terminal mounting areas 114 included in the mounting area 112, but as illustrated in the third embodiment described below, the mounting area 112 may include the terminal mounting area 114 in which the terminal 110 is not located.

A plurality of signals including the memory control signals MC, the low-speed communication signal LC, the high-speed communication signal HC, the data signal Di, and the data signal Do propagating between the semiconductor apparatus 1 and the external memory group 2, the external circuit 3, and the emulator circuit 4, and the voltages VDD and VSS input to the semiconductor apparatus 1 propagate via each of the plurality of terminals 110 provided at the terminal mounting surface 101. Therefore, with reference to FIG. 4, a specific example of arrangement of the terminals 110 to which the various signals propagating between the semiconductor apparatus 1 and the external memory group 2, the external circuit 3, and the emulator circuit 4, and the voltages VDD and VSS are assigned is described. FIG. 4 is a diagram illustrating an example when signals propagating at the plurality of terminals 110 in the semiconductor apparatus 1 are assigned to each terminal 110.

As illustrated in FIG. 4, the terminal mounting surface 101 includes a memory operation terminal group 121 including the plurality of terminals 110 for inputting the memory control signal MC propagating between the external memory group 2 and the memory controller 20, a first high-speed communication terminal group 122 including the plurality of terminals 110 for inputting the high-speed communication signal HC to the USB communication controller 31a included in the high-speed communication controller 31, a second high-speed communication terminal group 123 including the plurality of terminals 110 for inputting the high-speed communication signal HC to the PCIe communication controller 31b included in the high-speed communication controller 31, a first low-speed communication terminal group 124 including the plurality of terminals 110 for inputting the low-speed communication signal LC to the UART communication controller 32a included in the low-speed communication controller 32, a second low-speed communication terminal group 125 including the plurality of terminals 110 for inputting the low-speed communication signal LC to the I2C communication controller 32b included in the low-speed communication controller 32, and an inspection terminal group 126 including the plurality of terminals 110 for acquiring information from the CPU 10 and performing debugging. Further, the terminal mounting surface 101 includes a CPU input and output terminal group 131 including the plurality of terminals 110 for propagating a signal input from the outside to the CPU 10, a power supply terminal group 132 including the plurality of terminals 110 for supplying the voltages VDD and VSS to the semiconductor apparatus 1, and a constant voltage terminal group 133 including the plurality of terminals 110 in which a constant voltage value is held. Here, the constant voltage value held in the constant voltage terminal group 133 according to the present embodiment is, for example, the voltage VSS of a ground potential. In other words, the voltage values of the plurality of terminals 110 included in the constant voltage terminal group 133 are held constant at a ground potential. Although the description is omitted, in addition to the plurality of terminals 110 for inputting and outputting the various signals described above, the plurality of terminals 110 for inputting clock signals, other analog signals, and other digital signals are provided in the terminal mounting surface 101.

The memory operation terminal group 121 includes the plurality of terminals 110 located in the area on the side 103 side of the terminal mounting surface 101. Specifically, the memory operation terminal group 121 includes the terminals 110-1T to 110-18T arranged in the terminal mounting areas 114-1T to 114-18T located on the most side 103 side in the mounting area 112, the terminals 110-1S to 110-18S located in the terminal mounting areas 114-1S to 114-18S located adjacent to each of the terminal mounting areas 114-1T to 114-18T on the −Y side, the terminals 110-1R to 110-18R located in the terminal mounting areas 114-1R to 114-18R located adjacent to each of the terminal mounting areas 114-1S to 114-18S on the −Y side, the terminals 110-1Q to 110-18Q located in the terminal mounting areas 114-1Q to 114-18Q located adjacent to each of the terminal mounting areas 114-1R to 114-18R on the −Y side, the terminals 110-1P to 110-18P located in the terminal mounting areas 114-1P to 114-18P located adjacent to each of the terminal mounting areas 114-1Q to 114-18Q on the −Y side, and the terminals 110-1N to 110-18N located in the terminal mounting areas 114-1N to 114-18N located adjacent to each of the terminal mounting areas 114-1P to 114-18P on the −Y side, among the plurality of terminal mounting areas 114 included in the mounting area 112.

That is, among the plurality of terminals 110 included in the memory operation terminal group 121, the terminals 110-1N, 110-1P, 110-1Q, 110-1R, 110-1S, and 110-1T are located adjacent to the side 104, which is one of outer circumferences of the terminal mounting surface 101, the terminals 110-1T to 110-18T are located adjacent to the side 103, which is one of the outer circumferences of the terminal mounting surface 101, and the terminals 110-18N, 110-18P, 110-18Q, 110-18R, 110-18S, and 110-18T are located adjacent to the side 105, which is one of the outer circumferences of the terminal mounting surface 101. In other words, the terminals 110-1T to 110-18T among the plurality of terminals 110 included in the memory operation terminal group 121 are located adjacent to the outer circumference of the terminal mounting surface 101, and more specifically, the terminals 110-1T to 110-18T among the plurality of terminals 110 included in the memory operation terminal group 121 are located adjacent to the side 103 of the terminal mounting surface 101.

Here, the fact that each of the terminals 110-1T to 110-18T and the side 103 of the terminal mounting surface 101 are located adjacent to each other means that the terminal mounting area 114 in which the terminal 110 can be provided is not located between the terminal mounting areas 114-1T to 114-18T in which the terminals 110-1T to 110-18T are mounted and the side 103 of the terminal mounting surface 101, and specifically means that at least one of the terminals 110-1T to 110-18T is located closest to the vicinity of the side 103, among the plurality of terminals 110 provided at the terminal mounting surface 101, and means that the terminal mounting area 114 in which at least one of the terminals 110-1T to 110-18T is located is located closest to the vicinity of the side 103, among the plurality of terminal mounting areas 114 provided at the terminal mounting surface 101.

The memory control signal MC propagating between the corresponding memory cell circuit included in the external memory group 2 and the memory controller 20 propagates to each of the plurality of terminals 110 included in the memory operation terminal group 121. The memory operation terminal group 121 may include the terminal 110 which holds a constant voltage based on the voltage VDD and the terminal 110 which holds the voltage VSS which is a ground potential.

Here, the terminals 110-1N to 110-18N, 110-1P to 110-18P, 110-1Q to 110-18Q, 110-1R to 110-18R, 110-1S to 110-18S, and 110-1T to 110-18T, which are the plurality of terminals 110 included in the memory operation terminal group 121 are examples of a plurality of memory operation terminals, and at least one of the terminals 110-1T to 110-18T is an example of a second memory operation terminal.

The constant voltage terminal group 133 includes the plurality of terminals 110 located in the area on the side 102 side of the memory operation terminal group 121. Specifically, the constant voltage terminal group 133 includes the terminals 110-1M to 110-13M located in the terminal mounting areas 114-1M to 114-13M, among the plurality of terminal mounting areas 114 included in the mounting area 112. Each of the terminals 110-1M to 110-13M included in the constant voltage terminal group 133 holds the voltage VSS having a constant voltage value at a ground potential.

The inspection terminal group 126 includes the plurality of terminals 110 located at an area, which is an area on the side 102 side of the memory operation terminal group 121, on the side 105 side of the constant voltage terminal group 133. Specifically, the inspection terminal group 126 includes the terminals 110-14M to 110-18M located in the terminal mounting areas 114-14M to 114-18M, among the plurality of terminal mounting areas 114 included in the mounting area 112. That is, the plurality of terminals 110 included in the inspection terminal group 126 and the terminals 110-14M to 110-18M included in the constant voltage terminal group 133 are located side by side along the row direction at the terminal mounting surface 101.

The data signals Di and Do are input to each of the terminals 110-14M to 110-18M included in the inspection terminal group 126 as signals for executing debugging in accordance with the JTAG standard. That is, the inspection terminal group 126 includes the terminals 110-14M to 110-18M to which signals for executing a test in accordance with the JTAG standard are input as the debugging, and the terminals 110-14M to 110-18M are located side by side at the terminal mounting surface 101.

Here, the terminals 110-14M to 110-18M included in the inspection terminal group 126 for debugging are examples of a plurality of inspection terminals, and at least one of the terminals 110-14M to 110-18M is an example of a first inspection terminal, another one of the terminals 110-14M to 110-18M is an example of a second inspection terminal, and the other one of the terminals 110-14M to 110-18M is an example of a third inspection terminal.

The first high-speed communication terminal group 122 is an area on the side 102 side of the constant voltage terminal group 133 and the inspection terminal group 126 located side by side along the row direction, and includes the plurality of terminals 110 located in an area on the side 105 side of the terminal mounting surface 101. That is, at the terminal mounting surface 101, at least one of the terminals 110-14M to 110-18M included in the inspection terminal group 126 is located between the memory operation terminal group 121 and the first high-speed communication terminal group 122 in the direction along the Y-direction.

Specifically, the first high-speed communication terminal group 122 includes the terminals 110-13L to 110-18L located in the terminal mounting areas 114-13L to 114-18L and the terminals 110-13K to 110-18K located in the terminal mounting areas 114-13K to 114-18K, among the plurality of terminal mounting areas 114 included in the mounting area 112.

Among the plurality of terminals 110 included in the first high-speed communication terminal group 122, the terminals 110-18K and 110-18L are located adjacent to the side 105 which is one of the outer circumferences of the terminal mounting surface 101. That is, the terminals 110-18K and 110-18L among the terminals 110-13L to 110-18L and 110-13K to 110-18K included in the first high-speed communication terminal group 122 are located adjacent to the outer circumference of the terminal mounting surface 101, and in detail, the terminals 110-18K and 110-18L among the terminals 110-13L to 110-18L and 110-13K to 110-18K included in the first high-speed communication terminal group 122 are located adjacent to the side 105 of the terminal mounting surface 101.

Here, the fact that each of the terminals 110-18K and 110-18L and the side 105 of the terminal mounting surface 101 are located adjacent to each other means that the terminal mounting area 114 in which the terminal 110 can be provided is not located between the terminal mounting areas 114-18K and 114-18L in which the terminals 110-18K and 110-18L are mounted and the side 105 of the terminal mounting surface 101, specifically, means that at least one of the terminals 110-18K and 110-18L among the plurality of terminals 110 provided at the terminal mounting surface 101 is located closest to the vicinity of the side 105, and the located terminal mounting area 114 in which at least one of the terminals 110-18K and 110-18L among the plurality of terminal mounting areas 114 provided at the terminal mounting surface 101 is located is located closest to the vicinity of the side 105.

A plurality of signals in accordance with the USB communication standard propagating between the USB communication controller 31a included in the high-speed communication controller 31 and the external circuit 3 are input to each of the plurality of terminals 110 included in the first high-speed communication terminal group 122 as the high-speed communication signal HC. The first high-speed communication terminal group 122 may include the terminal 110 which holds a constant voltage based on the voltage VDD and the terminal 110 which holds the voltage VSS which is a ground potential.

Here, the terminals 110-13K to 110-18K and 110-13L to 110-18L included in the first high-speed communication terminal group 122 are examples of a plurality of high-speed communication terminals, and at least one of the terminals 110-18K and 110-18L is an example of a second high-speed communication terminal, and the first high-speed communication terminal group 122 is an example of a high-speed communication terminal group.

The CPU input and output terminal group 131 includes the plurality of terminals 110 located in an area on the side 102 side of the first high-speed communication terminal group 122. Specifically, among the plurality of terminal mounting areas 114 included in the mounting area 112, the CPU input and output terminal group 131 includes the terminals 110-13G to 110-18G, 110-13H to 110-18H, and 110-13J to 110-18J which are respectively located in the terminal mounting areas 114-13G to 114-18G, 114-13H to 114-18H, and 114-13J to 114-18J. The CPU input and output terminal group 131 may include the terminal 110 which holds a constant voltage based on the voltage VDD and the terminal 110 which holds the voltage VSS which is a ground potential.

A control signal input to the CPU 10 and a signal output from the CPU 10 to the outside of the semiconductor apparatus 1 propagate to each of the plurality of terminals 110 included in the CPU input and output terminal group 131.

The power supply terminal group 132 includes the plurality of terminals 110 located in an area on the side 104 side of the first high-speed communication terminal group 122 and the CPU input and output terminal group 131. Specifically, among the plurality of terminal mounting areas 114 included in the mounting area 112, the power supply terminal group 132 includes the terminals 110-7G to 110-12G, 110-7H to 110-12H, 110-7J to 110-12J, 110-7K to 110-12K, 110-7L to 110-12L, and 110-7M to 110-12M which are respectively located in the terminal mounting areas 114-7G to 114-12G, 114-7H to 114-12H, 114-7J to 114-12J, 114-7K to 114-12K, 114-7L to 114-12L, and 114-7M to 114-12M.

The voltage VDD as a power supply voltage of the semiconductor apparatus 1 and the voltage VSS as a reference potential of the semiconductor apparatus 1 are input to each of the plurality of terminals 110 included in the power supply terminal group 132.

The first low-speed communication terminal group 124 includes the plurality of terminals 110 located in an area, which is an area on the side 102 side of the CPU input and output terminal group 131, on the side 105 side of the terminal mounting surface 101. Specifically, among the plurality of terminal mounting areas 114 included in the mounting area 112, the first low-speed communication terminal group 124 includes the terminals 110-17A, 110-18A, 110-17B, 110-18B, 110-17C, 110-18C, 110-17D, 110-18D, 110-17E, 110-18E, 110-17F, and 110-18F which are respectively located in the terminal mounting areas 114-17A, 114-18A, 114-17B, 114-18B, 114-17C, 114-18C, 114-17D, 114-18D, 114-17E, 114-18E, 114-17F, and 114-18F.

A plurality of signals in accordance with the UART communication standard propagating between the UART communication controller 32a included in the low-speed communication controller 32 and the external circuit 3 are input to each of the plurality of terminals 110 included in the first low-speed communication terminal group 124 as the low-speed communication signal LC. The first low-speed communication terminal group 124 may include the terminal 110 which holds a constant voltage based on the voltage VDD and the terminal 110 which holds the voltage VSS which is a ground potential.

The second high-speed communication terminal group 123 includes the plurality of terminals 110 located in an area, which is an area on the side 102 side of the power supply terminal group 132 and the CPU input and output terminal group 131, on the side 104 side of the first low-speed communication terminal group 124. Specifically, among the plurality of terminal mounting areas 114 included in the mounting area 112, the second high-speed communication terminal group 123 includes the terminals 110-11A to 110-16A, 110-11B to 110-16B, 110-11C to 110-16C, 110-11D to 110-16D, 110-11E to 110-16E, and 110-11F to 110-16F which are respectively located in the terminal mounting areas 114-11A to 114-16A, 114-11B to 114-16B, 114-11C to 114-16C, 114-11D to 114-16D, 114-11E to 114-16E, and 114-11F to 114-16F.

Therefore, as illustrated in FIG. 4, at the terminal mounting surface 101, among the terminals 110-14M to 110-18M included in the inspection terminal group 126, the terminal 110-14M is located between the memory operation terminal group 121 and the second high-speed communication terminal group 123 along the Y-direction. That is, the second high-speed communication terminal group 123 including the plurality of terminals 110 for inputting the high-speed communication signal HC to the PCIe communication controller 31b included in the high-speed communication controller 31 is another example of the high-speed communication terminal group.

A plurality of signals in accordance with the PCIe communication standard propagating between the PCIe communication controller 31b included in the high-speed communication controller 31 and the external circuit 3 are input to each of the plurality of terminals 110 included in the second high-speed communication terminal group 123 as the high-speed communication signal HC. The second high-speed communication terminal group 123 may include the terminal 110 which holds a constant voltage based on the voltage VDD and the terminal 110 which holds the voltage VSS which is a ground potential.

The second low-speed communication terminal group 125 includes the plurality of terminals 110 located in an area, which is an area on the side 102 side of the power supply terminal group 132, on the side 104 side of the second high-speed communication terminal group 123. Specifically, among the plurality of terminal mounting areas 114 included in the mounting area 112, the second low-speed communication terminal group 125 includes the terminals 110-7A to 110-10A, 110-7B to 110-10B, 110-7C to 110-10C, 110-7D to 110-10D, 110-7E to 110-10E, and 110-7F to 110-10F which are respectively located in the terminal mounting areas 114-7A to 114-10A, 114-7B to 114-10B, 114-7C to 114-10C, 114-7D to 114-10D, 114-7E to 114-10E, and 114-7F to 114-10F.

A plurality of signals in accordance with the I2C communication standard propagating between the I2C communication controller 32b included in the low-speed communication controller 32 and the external circuit 3 are input to each of the plurality of terminals 110 included in the second low-speed communication terminal group 125 as the low-speed communication signal LC. The second low-speed communication terminal group 125 may include the terminal 110 which holds a constant voltage based on the voltage VDD and the terminal 110 which holds the voltage VSS which is a ground potential.

At the terminal mounting surface 101 provided with the plurality of terminals 110 as described above, at least one of the terminals 110-14M to 110-18M included in the inspection terminal group 126 is located between the memory operation terminal group 121 and the first high-speed communication terminal group 122, and each of the terminals 110-14M to 110-18M included in the inspection terminal group 126 is located adjacent to each of the terminals 110-14N to 110-18N among the plurality of terminals 110 included in the memory operation terminal group 121 and each of the terminals 110-14L to 110-18L among the plurality of terminals 110 included in the first high-speed communication terminal group 122.

Here, among the plurality of terminals 110 included in the memory operation terminal group 121, any one of the terminals 110-14N to 110-18N adjacent to any one of the terminals 110-14M to 110-18M is an example of a first memory operation terminal, and among the plurality of terminals 110 included in the first high-speed communication terminal group 122, any one of the terminals 110-14L to 110-18L adjacent to any one of the terminals 110-14M to 110-18M is an example of a first high-speed communication terminal.

Further, the memory control signal MC input to the memory operation terminal group 121 is an example of a first signal, and the high-speed communication signal HC input to the first high-speed communication terminal group 122 is an example of a second signal. Among the plurality of terminals 110 included in the constant voltage terminal group 133, the terminal 110-13M located between the memory operation terminal group 121 and the first high-speed communication terminal group 122 is an example of a first constant voltage terminal, and the voltage VSS propagating from the terminal 110-13M is an example of a first voltage.

Figure 5:
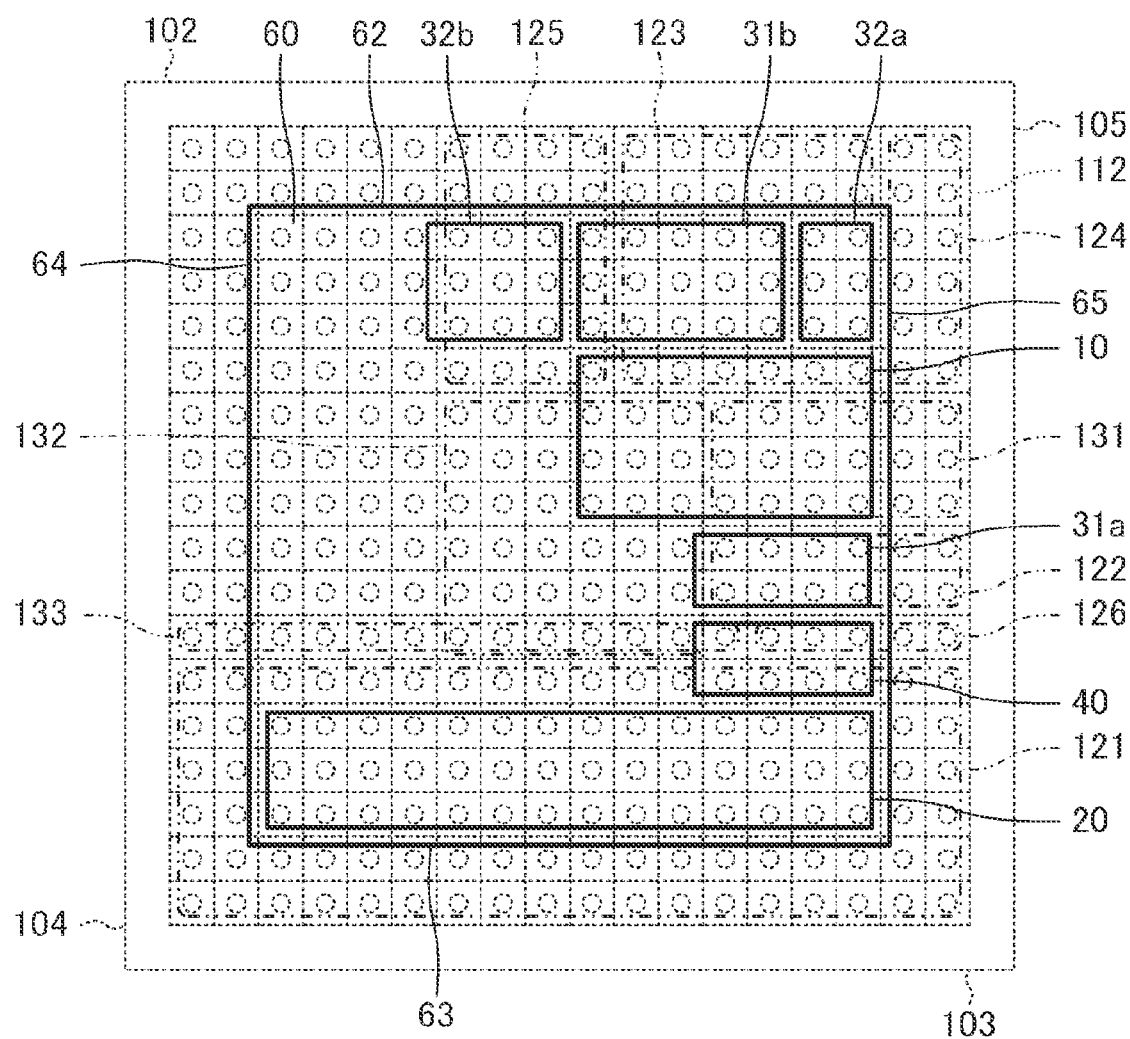
FIG. 5 is a diagram illustrating an example of a circuit arrangement in an IC chip.

1.4 Relationship Between Terminal Arrangement and Circuit Arrangement in Semiconductor Apparatus Next, a relationship between arrangement of the plurality of terminals 110 at the terminal mounting surface 101 and arrangement of circuits provided at the IC chip 60 will be described. FIG. 5 is a diagram illustrating an example of circuit arrangement in the IC chip 60. FIG. 5 illustrates the circuit arrangement of the IC chip 60 when the semiconductor apparatus 1 is viewed from the terminal mounting surface 101 side. Further, in FIG. 5, the terminal mounting surface 101 and the terminals 110 provided at the terminal mounting surface 101 are illustrated by broken lines.

As illustrated in FIG. 5, the IC chip 60 includes sides 62 and 63 which are located extending in a direction along the X-direction and facing each other in a direction along the Y-direction, and sides 64 and 65 which are located extending in the direction along the Y-direction and facing each other in the direction along the X-direction The side 64 intersects both the sides 62 and 63, and the side 65 intersects both the sides 62 and 63. That is, the IC chip 60 has a substantially rectangular shape having the sides 62 to 65 as an outer circumference. The IC chip 60 is attached to the printed wiring substrate 100 including the terminal mounting surface 101 so that the side 62 is on the side 102 side of the terminal mounting surface 101, the side 63 is on the side 103 side of the terminal mounting surface 101, the side 64 is on the side 104 side of the terminal mounting surface 101, and the side 65 is on the side 105 side of the terminal mounting surface 101.

The IC chip 60 is provided with a plurality of circuits including the CPU 10, the memory controller 20, the USB communication controller 31a, the PCIe communication controller 31b, the UART communication controller 32a, the I2C communication controller 32b, and the debug circuit 40 described above. The IC chip 60 may be provided with a circuit other than the circuit described above.

The memory controller 20 is located in an area of the IC chip 60 on the side 63 side, and extends in a direction along the side 63. That is, in the IC chip 60, the memory controller 20 is located closer to the vicinity of the side 63 than the side 62 in the IC chip 60, and is located along the side 63. Further, as described above, the IC chip 60 is attached to the printed wiring substrate 100 so that the side 63 is located on the side 103 side of the terminal mounting surface 101. Therefore, it can be said that the memory controller 20 is located in an area in the vicinity of the side 103 of the terminal mounting surface 101, at the IC chip 60. In other words, in the semiconductor apparatus 1, the memory controller 20 is provided at a position at which the shortest distance from the memory controller 20 to the side 103 is shorter than the shortest distance from the memory controller 20 to the side 102.

Here, as described above, the memory operation terminal group 121 including the plurality of terminals 110 to which the memory control signal MC propagating between the memory cell circuit included in the external memory group 2 and the memory controller 20 is input is also located in an area in the vicinity of the side 103 of the terminal mounting surface 101. Therefore, it is possible to shorten a wiring length of a wiring which electrically couples the memory operation terminal group 121 and the memory controller 20 to which the memory control signal MC is input. As a result, the possibility that wiring impedance contributes to the memory control signal MC propagating between the memory controller 20 and the external memory group 2 is reduced, and signal accuracy of the propagated memory control signal MC is improved.

The debug circuit 40 is located in an area, which is an area on the side 62 side of the memory controller 20 in the IC chip 60, on the side 65 side of the IC chip 60. That is, in the IC chip 60, the debug circuit 40 is located closer to the vicinity of the side 65 than the side 64 of the IC chip 60. Further, as described above, the IC chip 60 is attached to the printed wiring substrate 100 so that the side 65 is located on the side 105 side of the terminal mounting surface 101. Therefore, it can be said that the debug circuit 40 is located in an area in the vicinity of the side 105 of the terminal mounting surface 101, at the IC chip 60. In other words, in the semiconductor apparatus 1, the debug circuit 40 is provided at a position at which the shortest distance from the debug circuit 40 to the side 105 is shorter than the shortest distance from the debug circuit 40 to the side 104.

Here, as described above, the inspection terminal group 126 including the plurality of terminals 110 for propagating the data signals Di and Do between the emulator circuit 4 and the debug circuit 40 is also located in an area in the vicinity of the side 105 of the terminal mounting surface 101. Therefore, the data signals Di and Do propagate, and a wiring length of a wiring which electrically couples the inspection terminal group 126 and the debug circuit 40 can be shortened. As a result, the possibility that wiring impedance contributes to the data signals Di and Do propagating between the debug circuit 40 and the emulator circuit 4 is reduced, and signal accuracy of the propagated data signals Di and Do is improved.

The USB communication controller 31a is located in an area, which is an area on the side 62 side of the debug circuit 40 in the IC chip 60, on the side 65 side of the IC chip 60. That is, in the IC chip 60, the USB communication controller 31a is located, in an area on the side 62 side of the memory controller 20, closer to the vicinity of the side 65 than the side 64 of the IC chip 60. Further, as described above, the IC chip 60 is attached to the printed wiring substrate 100 so that the side 62 is located on the side 102 side of the terminal mounting surface 101, the side 63 is located on the side 103 side of the terminal mounting surface 101, and the side 65 is located on the side 105 side of the terminal mounting surface 101. Therefore, it can be said that the USB communication controller 31a is located in an area, which is an area on the side 102 side of the memory controller 20, in the vicinity of the side 105 of the terminal mounting surface 101, at the IC chip 60. In other words, in the semiconductor apparatus 1, the USB communication controller 31a is provided at a position at which the shortest distance from the side 103 to the memory controller 20 located facing the side 102 is shorter than the shortest distance from the side 103 to the USB communication controller 31a, and the shortest distance from the USB communication controller 31a to the side 105 is shorter than the shortest distance from the USB communication controller 31a to the side 104.

Here, as described above, the first high-speed communication terminal group 122 including the plurality of terminals 110 to which the high-speed communication signal HC propagating between the external circuit 3 and the USB communication controller 31a is input is also located in an area in the vicinity of the side 105 of the terminal mounting surface 101. Therefore, the high-speed communication signal HC propagates, and a wiring length of a wiring which electrically couples the first high-speed communication terminal group 122 and the USB communication controller 31a can be shortened. As a result, the possibility that wiring impedance contributes to the high-speed communication signal HC propagating between the USB communication controller 31a and the external circuit 3 is reduced, and signal accuracy of the propagated high-speed communication signal HC is improved.

The CPU 10 is located in an area, which is an area on the side 62 side of the USB communication controller 31*a* in the IC chip 60, on the side 65 side of the IC chip 60. That is, in the IC chip 60, the CPU 10 is located closer to the vicinity of the side 65 than the side 64 of the IC chip 60. Further, as described above, the IC chip 60 is attached to the printed wiring substrate 100 so that the side 65 is located on the side 105 side of the terminal mounting surface 101. Therefore, it can be said that the CPU 10 is located in an area in the vicinity of the side 105 of the terminal mounting surface 101, at the IC chip 60. In other words, in the semiconductor apparatus 1, the CPU 10 is provided at a position at which the shortest distance from the CPU 10 to the side 105 is shorter than the shortest distance from the CPU 10 to the side 104.

Here, as described above, the CPU input and output terminal group 131 including the plurality of terminals 110 to which a signal to be input to the CPU 10 or a signal to be output from the CPU 10 is input is also located in an area in the vicinity of the side 105 of the terminal mounting surface 101. Therefore, as described above, the signal input to the CPU 10 or the signal output from the CPU 10 propagates, and a wiring length of a wiring which electrically couples the CPU input and output terminal group 131 and the CPU 10 can be shortened. As a result, the possibility that wiring impedance contributes to the signal input to the CPU 10 or the signal output from the CPU 10 is reduced, and signal accuracy of the signal input to the propagated CPU 10 or the signal output from the CPU 10 is improved.

The UART communication controller 32*a* is located in an area, which is an area on the side 62 side of the CPU 10 in the IC chip 60, on the side 65 side of the IC chip 60 and on the side 62 side of the IC chip 60. That is, in the IC chip 60, the UART communication controller 32*a* is located closer to the vicinity of the side 65 than the side 64 of the IC chip 60 and closer to the vicinity of the side 62 than the side 63. Further, as described above, the IC chip 60 is attached to the printed wiring substrate 100 so that the side 65 is located on the side 105 side of the terminal mounting surface 101 and the side 62 is located on the side 102 side of the terminal mounting surface 101. Therefore, in the IC chip 60, it can be said that the UART communication controller 32*a* is located in an area, which is an area in the vicinity of the side 105 of the terminal mounting surface 101, in the vicinity of the side 102 of the terminal mounting surface 101. In other words, in the semiconductor apparatus 1, the UART communication controller 32*a* is provided at a position at which the shortest distance from the UART communication controller 32*a* to the side 105 is shorter than the shortest distance from the UART communication controller 32*a* to the side 104, and the shortest distance from the UART communication controller 32*a* to the side 102 is shorter than the shortest distance from the UART communication controller 32*a* to the side 103.

Here, as described above, the first low-speed communication terminal group 124 including the plurality of terminals 110 to which the low-speed communication signal LC propagating between the external circuit 3 and the UART communication controller 32*a* is input is also located in an area, which is in the vicinity of the side 105 of the terminal mounting surface 101, in the vicinity of the side 102 of the terminal mounting surface 101. Therefore, the low-speed communication signal LC propagates, and a wiring length of a wiring which electrically couples the first low-speed communication terminal group 124 and the UART communication controller 32*a* can be shortened. As a result, the possibility that wiring impedance contributes to the low-speed communication signal LC propagating between the UART communication controller 32*a* and the external circuit 3 is reduced, and signal accuracy of the propagated low-speed communication signal LC is improved.

The PCIe communication controller 31*b* is located in an area, which is an area on the side 62 side of the IC chip 60, on the side 62 side of the CPU in the IC chip 60 and on the side 64 side of the UART communication controller 32*a*. That is, in the IC chip 60, the PCIe communication controller 31*b* is located closer to the vicinity of the side 62 than the side 63 of the IC chip 60. Further, as described above, the IC chip 60 is attached to the printed wiring substrate 100 so that the side 62 is located on the side 102 side of the terminal mounting surface 101. Therefore, it can be said that the PCIe communication controller 31*b* is located in an area in the vicinity of the side 102 of the terminal mounting surface 101, at the IC chip 60. In other words, in the semiconductor apparatus 1, the PCIe communication controller 31*b* is provided at a position at which the shortest distance from the PCIe communication controller 31*b* to the side 102 is shorter than the shortest distance from the PCIe communication controller 31*b* to the side 103.

Here, as described above, the second high-speed communication terminal group 123 including the plurality of terminals 110 to which the high-speed communication signal HC propagating between the external circuit 3 and the PCIe communication controller 31*b* is input is also located in an area in the vicinity of the side 102 of the terminal mounting surface 101. Therefore, the high-speed communication signal HC propagates, and a wiring length of a wiring which electrically couples the second high-speed communication terminal group 123 and the PCIe communication controller 31*b* can be shortened. As a result, the possibility that wiring impedance contributes to the high-speed communication signal HC propagating between the PCIe communication controller 31*b* and the external circuit 3 is reduced, and signal accuracy of the propagated high-speed communication signal HC is improved.

The I2C communication controller 32*b* is located in an area, which is an area on the side 62 side of the IC chip 60, on the side 64 side of the PCIe communication controller 31*b* in the IC chip 60. That is, in the IC chip 60, the I2C communication controller 32*b* is located in an area closer to the vicinity of the side 62 than the side 63 of the IC chip 60. Further, as described above, the IC chip 60 is attached to the printed wiring substrate 100 so that the side 62 is located on the side 102 side of the terminal mounting surface 101. Therefore, it can be said that the I2C communication controller 32*b* is located in an area in the vicinity of the side 102 of the terminal mounting surface 101, at the IC chip 60. In other words, in the semiconductor apparatus 1, the I2C communication controller 32*b* is provided at a position at which the shortest distance from the I2C communication controller 32*b* to the side 102 is shorter than the shortest distance from the I2C communication controller 32*b* to the side 103.

Here, as described above, the second low-speed communication terminal group 125 including the plurality of terminals 110 to which the low-speed communication signal LC propagating between the external circuit 3 and the I2C communication controller 32*b* is input is also located in an area in the vicinity of the side 102 of the terminal mounting surface 101. Therefore, the low-speed communication signal LC propagates, and a wiring length of a wiring which electrically couples the second low-speed communication terminal group 125 and the I2C communication controller 32*b* can be shortened. As a result, the possibility that wiring impedance contributes to the low-speed communication signal LC propagating between the I2C communication controller 32b and the external circuit 3 is reduced, and signal accuracy of the propagated low-speed communication signal LC is improved.

1.5 Action and Effect

In the semiconductor apparatus 1 according to the present embodiment described above, the plurality of terminals 110 included in the inspection terminal group 126 is located between the memory operation terminal group 121 including the plurality of terminals 110 for propagating the memory control signal MC between the external memory group 2 and the memory controller 20 and the first high-speed communication terminal group 122 for propagating the high-speed communication signal HC to the USB communication controller 31a included in the high-speed communication controller 31 capable of high-speed communication. The inspection terminal group 126 includes the plurality of terminals 110 for debugging the semiconductor apparatus 1. That is, when the semiconductor apparatus 1 is debugged, a predetermined signal of which a voltage value fluctuates propagates to the plurality of terminals 110 included in the inspection terminal group 126.

On the other hand, when debugging on the semiconductor apparatus 1 is not executed, and when the memory control signal MC propagating between the external memory group 2 and the memory controller 20 propagates to the memory operation terminal group 121 or when the high-speed communication signal HC to be input or output to the USB communication controller 31a included in the high-speed communication controller 31 propagates to the first high-speed communication terminal group 122, a constant voltage value is held at the voltage VSS or the voltage VDD.

That is, when the debugging on the semiconductor apparatus 1 is executed, the plurality of terminals 110 included in the inspection terminal group 126 function as the terminals 110 to which a signal for executing the debugging is input, and when various signals propagate to the memory operation terminal group 121 and the first high-speed communication terminal group 122, the plurality of terminals 110 included in the inspection terminal group 126 function as shield terminals for reducing a possibility that the propagated signals interfere with each other between the memory operation terminal group 121 and the first high-speed communication terminal group 122. Therefore, it is possible to reduce the possibility that an area of the terminal mounting surface 101 in which the plurality of terminals 110 are mounted in the semiconductor apparatus 1 is enlarged, and the possibility that the signals propagating through the plurality of terminals 110 provided at the terminal mounting surface 101 of the semiconductor apparatus 1 interfere with each other.

In particular, in the semiconductor apparatus 1 according to the present embodiment, it possible to further improve the reliability of the semiconductor apparatus 1, by locating the plurality of terminals 110 included in the inspection terminal group 126 between the plurality of terminals 110 for propagating the high-speed communication signal HC to be input or output to or from the high-speed communication controller 31 in which high-frequency noise is likely to occur and the plurality of terminals 110 for propagating the memory control signal MC for reading information or writing information for executing various processes in the control of the semiconductor apparatus 1 including the CPU 10.

Further, in the semiconductor apparatus 1 according to the present embodiment, in addition to the plurality of terminals included in the inspection terminal group 126, the plurality of terminals 110 to which the voltage VSS is supplied as a constant voltage value are located between the memory operation terminal group 121 and the first high-speed communication terminal group 122. As a result, it is possible to further reduce the possibility that the signals propagating through the plurality of terminals 110 provided at the terminal mounting surface 101 of the semiconductor apparatus 1 interfere with each other.

In particular, in the semiconductor apparatus 1 according to the present embodiment, the terminal 110 is provided at a characteristic position for improving reliability of the semiconductor apparatus 1. As one method for improving the reliability of the semiconductor apparatus 1, it is conceivable to arrange the internal circuit of the semiconductor apparatus 1 at a characteristic position. Meanwhile, even when the internal circuit is provided at the characteristic position to improve the reliability of the semiconductor apparatus 1, when various signals input to the semiconductor apparatus 1 interfere with each other in the vicinity of the terminal 110, it becomes difficult to sufficiently improve the reliability of the semiconductor apparatus 1. On the other hand, in the semiconductor apparatus 1 according to the present embodiment, since the terminal 110 is provided at the characteristic position, mutual interference in the vicinity of the terminal 110 can be reduced with respect to an input or an output to or from the semiconductor apparatus 1. Therefore, it is possible to increase reliability of the signal input to the semiconductor apparatus 1, and as a result, it is possible to increase reliability of the signal in the semiconductor apparatus 1. That is, in the semiconductor apparatus 1 according to the present embodiment, the reliability of the signal in the semiconductor apparatus 1 is enhanced by providing the terminal 110 at the characteristic position for improving the reliability of the semiconductor apparatus 1.

1.6 Concept for Terminal Mounting Area

In the semiconductor apparatus 1 of the first embodiment, it is described that the plurality of terminals 110 are located corresponding to the terminal mounting areas 114 arranged in a grid pattern included in the mounting area 112, but the mounting area 112 and the terminal mounting area 114 can also be defined based on arrangement of the plurality of terminals 110 provided at the terminal mounting surface 101.

FIG. 6 is a diagram for explaining a case where the mounting area 112 and the terminal mounting area 114 are defined based on arrangement of the plurality of terminals 110 provided at the terminal mounting surface 101. In the example illustrated in FIG. 6, for the purpose of describing a specific when the mounting area 112 and the terminal mounting area 114 are defined based on arrangement of the plurality of terminals 110 provided at the terminal mounting surface 101, a case where the terminals 110 are not located in some of the terminal mounting areas 114 is illustrated. Further, in FIG. 6, in order to distinguish from the semiconductor apparatus 1 of the first embodiment, the terminal mounting surface 101 is referred to as a terminal mounting surface 101a, and the sides 102, 103, 104, and 105 are respectively referred to as sides 102a, 103a, 104a, and 105a. Further, in FIG. 6, the X-direction, the Y-direction, and the Z-direction, which are orthogonal to each other as illustrated in the drawing, will be used.

As illustrated in FIG. 6, the plurality of terminals 110 are located at the terminal mounting surface 101a. An intersection at which a virtual line passing through at least one terminal 110 in the row direction from the side 104a to the side 105a along the side 102a and a virtual line passing through at least one terminal 110 in the column direction from the side 102a to the side 103a along the side 104a intersect with each other corresponds to the terminal mounting area 114.

Specifically, in an example of arrangement of the terminals 110 illustrated in FIG. 6, 18 virtual lines in a direction along the side 102a and 18 virtual lines in a direction along the side 104a can be obtained. Therefore, when the example of the arrangement of the terminals 110 illustrated in FIG. 6 is used, a total of 324 intersections are generated at the terminal mounting surface 101a. That is, when the example of the arrangement of the terminals 110 illustrated in FIG. 6 is used, the terminal mounting surface 101a includes a total of 324 terminal mounting areas 114 arranged in a grid pattern.

Among the intersections at which a total of 324 virtual lines intersect, an area surrounded by an intersection closest to a point at which the side 102a and the side 104a intersect with each other, an intersection closest to a point at which the side 104a and the side 103a intersect with each other, an intersection closest to a point at which the side 103a and the side 105a intersect with each other, and an intersection closest to a point at which the side 105a and the side 102a intersect with each other corresponds to the mounting area 112.

As described above, even when the mounting area 112 and the terminal mounting area 114 are defined based on the arrangement of the plurality of terminals 110 provided at the terminal mounting surface 101, the same action and effect are obtained as when the plurality of terminals 110 are arranged in the mounting area 112 and the terminal mounting area 114 illustrated in FIGS. 3 to 5.

2. Second Embodiment

Figure 7:
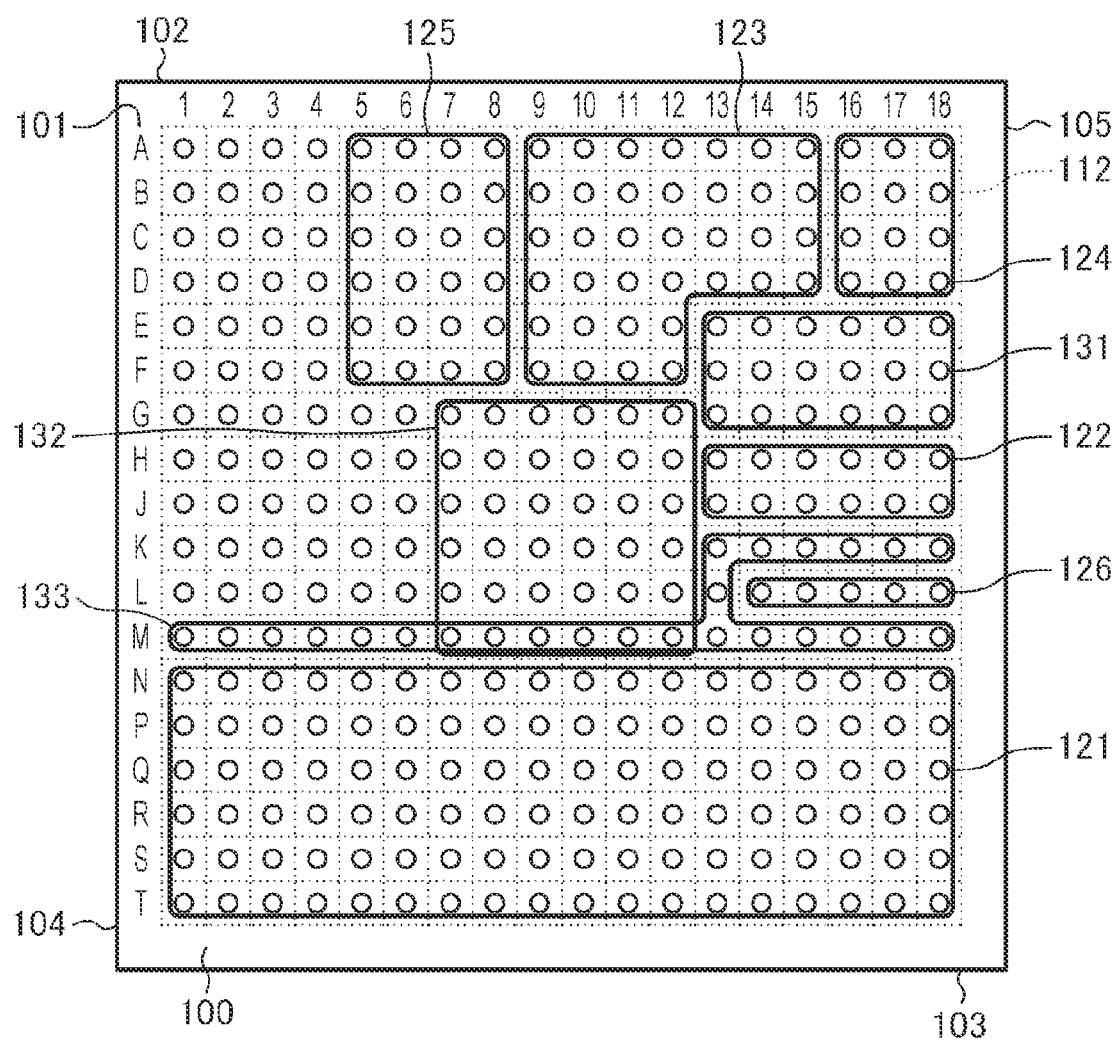
FIG. 7 is a diagram illustrating an example when signals propagating at a plurality of terminals in a semiconductor apparatus according to a second embodiment are assigned to each terminal.

Next, a configuration of the semiconductor apparatus 1 according to the second embodiment will be described with reference to FIG. 7. FIG. 7 is a diagram illustrating an example when signals propagating at the plurality of terminals 110 in the semiconductor apparatus 1 according to the second embodiment are assigned to each terminal 110.

As illustrated in FIG. 7, in the semiconductor apparatus 1 according to the second embodiment, the plurality of terminals 110 included in the constant voltage terminal group 133 held at a constant voltage is located between the plurality of terminals 110 included in the inspection terminal group 126 and the plurality of terminals 110 included in the memory operation terminal group 121, and the plurality of terminals 110 included in the constant voltage terminal group 133 held at a constant voltage is located between the plurality of terminals 110 included in the inspection terminal group 126 and the plurality of terminals 110 included in the first high-speed communication terminal group 122.

Specifically, as illustrated in FIG. 7, the terminals 110-14M to 110-18M included in the constant voltage terminal group 133 of which a voltage value is held constant at the voltage VSS are located between the terminals 110-14N to 110-18N included in the memory operation terminal group 121 and the terminals 110-14L to 110-18L included in the inspection terminal group 126, and the terminals 110-14K to 110-18K included in the constant voltage terminal group 133 of which a voltage value is held constant at the voltage VSS are located between the terminals 110-14J to 110-18J included in the first high-speed communication terminal group 122 and the terminals 110-14L to 110-18L included in the inspection terminal group 126.

As a result, when various signals are propagated to the memory operation terminal group 121 and the first high-speed communication terminal group 122, it is possible to increase the number of the plurality of terminals 110 held at a constant voltage value, which function as the shield members for reducing the possibility that the signals propagating between the memory operation terminal group 121 and the first high-speed communication terminal group 122 interfere with each other. That is, it is possible to further reduce the possibility that the signals propagating between the memory operation terminal group 121 and the first high-speed communication terminal group 122 interfere with each other.

Here, as illustrated in FIG. 7, the terminals 110-14L to 110-18L are examples of a plurality of inspection terminals according to the second embodiment, and the plurality of terminals including the terminals 110-14J to 110-18J included in the first high-speed communication terminal group 122 are examples of a plurality of high-speed communication terminals according to the second embodiment, any one of the terminals 110-14M to 110-18M included in the constant voltage terminal group 133 held at a constant voltage value is an example of a second constant voltage terminal, and any one of the terminals 110-14K to 110-18K is an example of a third constant voltage terminal. The voltage VSS held at the terminals 110-14M to 110-18M is an example of a second voltage, and the voltage VSS held at the terminals 110-14K to 110-18K is an example of a third voltage.

3. Third Embodiment

Next, a configuration of the semiconductor apparatus 1 according to the third embodiment will be described with reference to FIG. 8. FIG. 8 is a diagram illustrating an example when signals propagating at the plurality of terminals 110 in the semiconductor apparatus 1 according to the third embodiment are assigned to each terminal 110.

As illustrated in FIG. 8, in the semiconductor apparatus 1 according to the third embodiment, the terminals 110 are not mounted in some of the terminal mounting areas 114 in the mounting area 112 located at the terminal mounting surface 101. Even in the semiconductor apparatus 1 according to the present embodiment described above, the plurality of terminals 110 included in the inspection terminal group 126 is located between the memory operation terminal group 121 including the plurality of terminals 110 for propagating the memory control signal MC between the external memory group 2 and the memory controller 20 and the first high-speed communication terminal group 122 for propagating the high-speed communication signal HC to the USB communication controller 31a included in the high-speed communication controller 31 capable of high-speed communication, so that it is possible to obtain the same action and effect as the semiconductor apparatus 1 according to the first embodiment.

The embodiments and the modification examples are described above, but the disclosure is not limited to the present embodiment, and can be implemented in various aspects without departing from a gist thereof. For example, the above embodiments can be combined as appropriate.

The disclosure includes substantially the same configuration as the configuration described in the embodiment (for example, a configuration having the same function, method and result or a configuration having the same object and effect). In addition, the present disclosure includes a configuration in which non-essential parts of the configuration described in the embodiment are replaced. Further, the present disclosure includes a configuration which achieves the same action and effect as the configuration described in the embodiment or a configuration which can achieve the same object. In addition, the present disclosure includes a configuration in which a known technology is added to the configuration described in the embodiment.

The following contents are derived from the above-described embodiments and modification examples.

One aspect of a semiconductor apparatuses includes a memory controller; a CPU; a high-speed communication controller; a memory operation terminal group that includes a plurality of memory operation terminals for inputting a first signal propagating between an external memory group and the memory controller; a high-speed communication terminal group that includes a plurality of high-speed communication terminals for inputting a second signal to the high-speed communication controller; an inspection terminal group that includes a plurality of inspection terminals for acquiring information from the CPU and performing debugging; and a terminal mounting surface at which the memory operation terminal group, the high-speed communication terminal group, and the inspection terminal group are provided, in which at the terminal mounting surface, a first inspection terminal among the plurality of inspection terminals is located between the memory operation terminal group and the high-speed communication terminal group.

According to the semiconductor apparatus, any one of the plurality of inspection terminals included in the inspection terminal group is located between the memory operation terminal group including the plurality of memory operation terminals for propagating the memory control signal to be propagated between the external memory group and the memory controller and the high-speed communication terminal group including the plurality of high-speed communication terminals for inputting the second signal to the high-speed communication controller. Such an inspection terminal group propagates a predetermined signal of which a voltage value fluctuates when debugging is executed, and is held at a constant voltage value when the debugging on the semiconductor apparatus is not executed. That is, when the debugging on the semiconductor apparatus is executed, the plurality of inspection terminals included in the inspection terminal group function as terminals to which a signal for executing the debugging is input, and when the debugging on the semiconductor apparatus is not executed, the plurality of inspection terminals included in the inspection terminal group function as shield terminals for reducing mutual interference of the signals between the terminals. As described above, since the inspection terminals included in the inspection terminal group also serve as terminals for executing the debugging and the shield terminals, it is possible to reduce the possibility that an area of the terminal mounting surface at which the plurality of terminals are mounted in the semiconductor apparatus is enlarged, and the possibility that the signals propagating through the plurality of terminals provided at the terminal mounting surface of the semiconductor apparatus interfere with each other.

In one aspect of the semiconductor apparatus, a first constant voltage terminal of which a voltage value is held constant at a first voltage may be provided, and the first constant voltage terminal may be located between the memory operation terminal group and the high-speed communication terminal group.

According to the semiconductor apparatus, the first constant voltage terminal held at a constant voltage value is located between the memory operation terminal group and the high-speed communication terminal group, so that the first constant voltage terminal also functions as the shield terminal, in addition to the plurality of inspection terminals included in the inspection terminal group. Therefore, it is possible to further reduce the possibility that the signals propagating through the plurality of terminals provided at the terminal mounting surface of the semiconductor apparatus interfere with each other.

In one aspect of the semiconductor apparatus, the first voltage may be a ground potential.

In one aspect of the semiconductor apparatus, a second constant voltage terminal of which a voltage value is held constant at a second voltage may be provided, and the second constant voltage terminal may be located between the memory operation terminal group and the first inspection terminal.

According to the semiconductor apparatus, by providing the plurality of terminals held at a constant voltage value between the memory operation terminal group and the inspection terminal group, it is possible to further reduce the possibility that the signals propagating through the plurality of terminals provided at the terminal mounting surface of the semiconductor apparatus interfere with each other.

In one aspect of the semiconductor apparatus, a third constant voltage terminal of which a voltage value is held constant at a third voltage may be provided, and the third constant voltage terminal may be located between the high-speed communication terminal group and the first inspection terminal.

According to the semiconductor apparatus, by providing the plurality of terminals held at a constant voltage value between the high-speed communication terminal group and the inspection terminal group, it is possible to further reduce the possibility that the signals propagating through the plurality of terminals provided at the terminal mounting surface of the semiconductor apparatus interfere with each other.

In one aspect of the semiconductor apparatus, the first inspection terminal may be located adjacent to a first memory operation terminal among the plurality of memory operation terminals and a first high-speed communication terminal among the plurality of high-speed communication terminals.

In one aspect of the semiconductor apparatus, a second memory operation terminal among the plurality of memory operation terminals may be located adjacent to an outer circumference of the terminal mounting surface.

In one aspect of the semiconductor apparatus, a second high-speed communication terminal among the plurality of high-speed communication terminals may be located adjacent to the outer circumference of the terminal mounting surface.

In one aspect of the semiconductor apparatus, the terminal mounting surface may include a first side and a second side which intersects the first side, the second high-speed communication terminal among the plurality of high-speed communication terminals may be located adjacent to the first side, and the second memory operation terminal among the plurality of memory operation terminals may be located adjacent to the second side.

In one aspect of the semiconductor apparatus, the terminal mounting surface may include a third side located facing the first side and a fourth side located facing the second side, a shortest distance from the high-speed communication controller to the first side may be shorter than a shortest distance from the high-speed communication controller to the third side, a shortest distance from the memory controller to the second side may be shorter than a shortest distance from the memory controller to the fourth side, and a shortest distance from the second side to the memory controller may be shorter than a shortest distance from the second side to the high-speed communication controller.

According to the semiconductor apparatus, it is possible to shorten a wiring length in which the first signal input via the memory operation terminal group propagates to the memory controller and a wiring length in which the second signal input to the high-speed communication terminal group propagates to the high-speed communication controller. Therefore, the possibility that wiring impedance or the like affects the first signal and the second signal is reduced. Therefore, it is possible to further improve the reliability of the semiconductor apparatus.

In one aspect of the semiconductor apparatus, the first inspection terminal, the second inspection terminal among the plurality of inspection terminals, and the third inspection terminal among the plurality of inspection terminals may be located side by side at the terminal mounting surface.

In one aspect of the semiconductor apparatus, the first inspection terminal may be a terminal to which a signal for executing JTAG as the debugging is input.

In one aspect of the semiconductor apparatus, the high-speed communication controller may perform communication at a frequency equal to or more than 5 GHz.

According to the semiconductor apparatus, since it is possible to reduce the possibility that the signals propagating between the plurality of terminals provided at the terminal mounting surface of the semiconductor apparatus interfere with each other, even when the high-speed communication controller performs communication at a frequency equal to or more than 5 GHz, it is possible to improve the reliability of the semiconductor apparatus.

In one aspect of the semiconductor apparatus, the high-speed communication controller may include a USB communication controller which controls USB communication.

In one aspect of the semiconductor apparatus, the high-speed communication controller may include a PCIe communication controller which controls PCIe communication.

In one aspect of the semiconductor apparatus, the CPU may have a plurality of cores, include a microarchitecture which implements a command set of 64-bit or more, and be driven at a frequency equal to or more than 1.6 GHz.

In one aspect of the semiconductor apparatus, the CPU may have a floating point unit only inside.

According to the semiconductor apparatus, since the CPU has the floating point unit only inside, it is possible to reduce the number of passing-through circuit blocks as compared when the floating point unit only is provided externally. As a result, it is possible to operate at high speed while reducing power consumption when the CPU processes a large amount of data. Therefore, it is possible to increase a speed of the operation while reducing power consumption of the semiconductor apparatus.

What is claimed is:

1. A semiconductor apparatus comprising:
a memory controller;
a CPU;
a high-speed communication controller;
a memory operation terminal group that includes a plurality of memory operation terminals for inputting a first signal propagating between an external memory group and the memory controller;
a high-speed communication terminal group that includes a plurality of high-speed communication terminals for inputting a second signal to the high-speed communication controller;
an inspection terminal group that includes a plurality of inspection terminals for acquiring information from the CPU and performing debugging; and
a terminal mounting surface at which the memory operation terminal group, the high-speed communication terminal group, and the inspection terminal group are provided, wherein
the plurality of inspection terminals are aligned with respect to each other along a first direction of the terminal mounting surface, and
at the terminal mounting surface, a first inspection terminal among the plurality of inspection terminals is located between the memory operation terminal group and the high-speed communication terminal group in a second direction of the terminal mounting surface that intersects the first direction of the terminal mounting surface.

2. The semiconductor apparatus according to claim 1, further comprising:
a first constant voltage terminal of which a voltage value is held constant at a first voltage, wherein
the first constant voltage terminal is located between the memory operation terminal group and the high-speed communication terminal group.

3. The semiconductor apparatus according to claim 2, wherein
the first voltage is a ground potential.

4. The semiconductor apparatus according to claim 1, further comprising:
a second constant voltage terminal of which a voltage value is held constant at a second voltage, wherein
the second constant voltage terminal is located between the memory operation terminal group and the first inspection terminal.

5. The semiconductor apparatus according to claim 1, further comprising:
a third constant voltage terminal of which a voltage value is held constant at a third voltage, wherein
the third constant voltage terminal is located between the high-speed communication terminal group and the first inspection terminal.

6. The semiconductor apparatus according to claim 1, wherein
the first inspection terminal is located adjacent to a first memory operation terminal among the plurality of memory operation terminals and a first high-speed communication terminal among the plurality of high-speed communication terminals.

7. The semiconductor apparatus according to claim 1, wherein
a second memory operation terminal among the plurality of memory operation terminals is located adjacent to an outer circumference of the terminal mounting surface.

8. The semiconductor apparatus according to claim 1, wherein
a second high-speed communication terminal among the plurality of high-speed communication terminals is located adjacent to an outer circumference of the terminal mounting surface.

9. The semiconductor apparatus according to claim 1, wherein
the terminal mounting surface includes a first side and a second side which intersects the first side,
a second high-speed communication terminal among the plurality of high-speed communication terminals is located adjacent to the first side, and a second memory operation terminal among the plurality of memory operation terminals is located adjacent to the second side.

10. A semiconductor apparatus comprising:
a memory controller;
a CPU;
a high-speed communication controller;
a memory operation terminal group that includes a plurality of memory operation terminals for inputting a first signal propagating between an external memory group and the memory controller;
a high-speed communication terminal group that includes a plurality of high-speed communication terminals for inputting a second signal to the high-speed communication controller;
an inspection terminal group that includes a plurality of inspection terminals for acquiring information from the CPU and performing debugging; and
a terminal mounting surface at which the memory operation terminal group, the high-speed communication terminal group, and the inspection terminal group are provided, wherein
at the terminal mounting surface, a first inspection terminal among the plurality of inspection terminals is located between the memory operation terminal group and the high-speed communication terminal group,
the terminal mounting surface includes a first side and a second side which intersects the first side,
a second high-speed communication terminal among the plurality of high-speed communication terminals is located adjacent to the first side,
a second memory operation terminal among the plurality of memory operation terminals is located adjacent to the second side,
the terminal mounting surface includes a third side located facing the first side and a fourth side located facing the second side,
a shortest distance from the high-speed communication controller to the first side is shorter than a shortest distance from the high-speed communication controller to the third side,
a shortest distance from the memory controller to the second side is shorter than a shortest distance from the memory controller to the fourth side, and
a shortest distance from the second side to the memory controller is shorter than a shortest distance from the second side to the high-speed communication controller.

11. The semiconductor apparatus according to claim 1, wherein
the first inspection terminal is a terminal to which a signal for executing JTAG as the debugging is input.

12. The semiconductor apparatus according to claim 1, wherein
the high-speed communication controller performs communication at a frequency equal to or more than 5 GHz.

13. The semiconductor apparatus according to claim 1, wherein
the high-speed communication controller includes a USB communication controller that controls USB communication.

14. The semiconductor apparatus according to claim 1, wherein
the high-speed communication controller includes a PCIe communication controller that controls PCIe communication.

15. The semiconductor apparatus according to claim 1, wherein the CPU
has a plurality of cores,
includes a microarchitecture which implements a command set of 64-bit or more, and
is driven at a frequency equal to or more than 1.6 GHz.

16. The semiconductor apparatus according to claim 1, wherein
the CPU includes a floating point unit only inside.

* * * * *